(12) United States Patent
Lablans

(10) Patent No.: US 8,645,803 B2
(45) Date of Patent: Feb. 4, 2014

(54) METHODS AND SYSTEMS FOR RAPID ERROR CORRECTION BY FORWARD AND REVERSE DETERMINATION OF CODING STATES

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 246 days.

(21) Appl. No.: 13/103,300

(22) Filed: May 9, 2011

(65) Prior Publication Data

US 2011/0276854 A1 Nov. 10, 2011

Related U.S. Application Data

(60) Provisional application No. 61/332,974, filed on May 10, 2010.

(51) Int. Cl.
*H03M 13/00* (2006.01)

(52) U.S. Cl.
USPC ............................. 714/776; 714/746; 714/784

(58) Field of Classification Search
USPC .......................................... 714/746, 776, 784
See application file for complete search history.

(56) References Cited

U.S. PATENT DOCUMENTS

| | | | |
|---|---|---|---|
| 3,638,182 A | 1/1972 | Burton et al. | |
| 4,304,962 A | 12/1981 | Fracassi et al. | |
| 4,320,510 A | 3/1982 | Kojima | |
| 4,979,173 A | 12/1990 | Geldman et al. | |
| 5,280,488 A | 1/1994 | Glover et al. | |
| 5,297,153 A | 3/1994 | Baggen et al. | |
| 5,343,481 A | 8/1994 | Kraft | |
| 5,414,719 A | 5/1995 | Iwaki et al. | |
| 5,430,739 A | 7/1995 | Wei et al. | |
| 5,440,570 A | 8/1995 | Wei et al. | |
| 5,659,578 A | 8/1997 | Alamouti et al. | |
| 5,680,340 A | 10/1997 | Glover et al. | |
| 5,689,727 A | 11/1997 | Bonke et al. | |
| 5,729,559 A | 3/1998 | Bright et al. | |
| 5,875,200 A | 2/1999 | Glover et al. | |
| 5,914,969 A | 6/1999 | Yabuno et al. | |
| 5,925,144 A | 7/1999 | Sebaa | |
| 5,991,911 A | 11/1999 | Zook | |
| 5,996,105 A | 11/1999 | Zook | |

(Continued)

OTHER PUBLICATIONS

Tajima, M.; Shibata, K.; Kawasaki, Z., "Relation between encoder and syndrome former variables and symbol reliability estimation using a syndrome trellis," Communications, IEEE Transactions on , vol. 51, No. 9, pp. 1474,1484, Sep. 2003.*

(Continued)

*Primary Examiner* — Cynthia Britt

(57) ABSTRACT

An encoder creates an (p,k,n) n-state codeword with p n-state symbols of which k n-state symbols are data symbols, an n-state symbol being represented by a signal with $n>2$, $p>2$ and $k>(p-k)$. Intermediate states of an encoder in forward and in reverse direction are provided in a comparative n-state expression and implemented on a processor. A plurality of signals representing a codeword with at least one n-state symbol in error is processed by the processor by evaluating the comparative n-state expression. A partial result of an expression is determined after a symbol has been received. An error location and an error magnitude are determined. The error is corrected by the processor.

19 Claims, 16 Drawing Sheets

(56) References Cited

U.S. PATENT DOCUMENTS

| | | | |
|---|---|---|---|
| 6,052,815 | A | 4/2000 | Zook |
| 6,347,389 | B1 | 2/2002 | Boyer |
| 6,374,383 | B1* | 4/2002 | Weng ............................ 714/781 |
| 6,477,678 | B1 | 11/2002 | Fang et al. |
| 6,539,516 | B2 | 3/2003 | Cameron |
| 6,634,007 | B1 | 10/2003 | Koetter et al. |
| 6,651,212 | B1* | 11/2003 | Katayama et al. ............ 714/763 |
| 6,665,831 | B1 | 12/2003 | Yoshida et al. |
| 6,732,325 | B1 | 5/2004 | Tash et al. |
| 6,915,478 | B2 | 7/2005 | Cox |
| 7,054,386 | B1 | 5/2006 | Kosmach et al. |
| 7,203,893 | B2 | 4/2007 | Kerr et al. |
| 7,206,992 | B2 | 4/2007 | Xin |
| 7,788,570 | B1* | 8/2010 | Feng ............................ 714/784 |
| 2007/0192669 | A1* | 8/2007 | Hassner et al. ............... 714/785 |
| 2008/0104479 | A1* | 5/2008 | Lablans ........................ 714/757 |
| 2008/0178051 | A1* | 7/2008 | Huang .......................... 714/704 |
| 2010/0287451 | A1* | 11/2010 | Wu ............................... 714/781 |
| 2010/0299580 | A1* | 11/2010 | Neznanov et al. ........... 714/782 |
| 2012/0317456 | A1* | 12/2012 | Langner ....................... 714/752 |
| 2013/0042162 | A1* | 2/2013 | Muthu .......................... 714/755 |

OTHER PUBLICATIONS

Hank Wallace, Error Detection and Correction Using the BCH Code, 2001, available from the Internet at www.aqdi.com/bch.pdf.

Bernard Sklar, Reed-Solomon Codes, available from the Internet at: http://www.informit.com/content/images/art_sklar7_reed-solomon/elementLinks/art_sklar7_reed-solomon.pdf.

Final Office Action in U.S. Appl. No. 11/739,189, mailed Jul. 5, 2011, 18 pgs.

Final Office Action in U.S. Appl. No. 11/775,963, mailed Jun. 13, 2011, 13 pgs.

Non-Final Office Action in U.S. Appl. No. 11/775,963, mailed Jul. 27, 2011, 13 pgs.

Final Office Action in U.S. Appl. No. 11/775,963, dated Mar. 13, 2012, 10 pgs.

Final Office Action in U.S. Appl. No. 11/775,963, dated Oct. 14, 2011, 11 pgs.

Non-Final Office Action in U.S. Appl. No. 13/103,309, dated Nov. 15, 2011, 16 pgs.

* cited by examiner

Comparative states of first shift register element     1701

| 5 | 4 | 2 | 0 | 0 | 1 | 7 | 4 | 0 | 3 | 4 |
|---|---|---|---|---|---|---|---|---|---|---|
| 4 | 2 | 4 | 4 | 0 | 0 | 1 | 7 | 4 | 0 | 3 |
| 2 | 4 | 3 | 2 | 4 | 0 | 0 | 1 | 7 | 4 | 0 |
| 4 | 3 | 0 | 2 | 2 | 4 | 0 | 0 | 1 | 7 | 4 |
| 3 | 0 | 4 | 4 | 2 | 2 | 4 | 0 | 0 | 1 | 7 |
| 0 | 4 | 7 | 6 | 4 | 2 | 2 | 4 | 0 | 0 | 1 |
| 4 | 7 | 1 | 2 | 6 | 4 | 2 | 2 | 4 | 0 | 0 |
| 7 | 1 | 0 | 1 | 2 | 6 | 4 | 2 | 2 | 4 | 0 |
| 1 | 0 | 0 | 5 | 1 | 2 | 6 | 4 | 2 | 2 | 4 |

Comparative states of second shift register element     1702

| 0 | 2 | 2 | 0 | 1 | 0 | 3 | 3 | 3 | 1 | 5 |
|---|---|---|---|---|---|---|---|---|---|---|
| 2 | 2 | 5 | 3 | 0 | 1 | 0 | 3 | 3 | 3 | 1 |
| 2 | 5 | 1 | 2 | 3 | 0 | 1 | 0 | 3 | 3 | 3 |
| 5 | 1 | 3 | 4 | 2 | 3 | 0 | 1 | 0 | 3 | 3 |
| 1 | 3 | 3 | 5 | 4 | 2 | 3 | 0 | 1 | 0 | 3 |
| 3 | 3 | 3 | 7 | 5 | 4 | 2 | 3 | 0 | 1 | 0 |
| 3 | 3 | 0 | 5 | 7 | 5 | 4 | 2 | 3 | 0 | 1 |
| 3 | 0 | 1 | 6 | 5 | 7 | 5 | 4 | 2 | 3 | 0 |
| 0 | 1 | 0 | 2 | 6 | 5 | 7 | 5 | 4 | 2 | 3 |

Comparative states of third shift register element     1703

| 1 | 6 | 1 | 1 | 0 | 0 | 5 | 4 | 1 | 0 | 7 |
|---|---|---|---|---|---|---|---|---|---|---|
| 6 | 1 | 7 | 6 | 1 | 0 | 0 | 5 | 4 | 1 | 0 |
| 1 | 7 | 0 | 6 | 6 | 1 | 0 | 0 | 5 | 4 | 1 |
| 7 | 0 | 1 | 1 | 6 | 6 | 1 | 0 | 0 | 5 | 4 |
| 0 | 1 | 4 | 3 | 1 | 6 | 6 | 1 | 0 | 0 | 5 |
| 1 | 4 | 5 | 6 | 3 | 1 | 6 | 6 | 1 | 0 | 0 |
| 4 | 5 | 0 | 5 | 6 | 3 | 1 | 6 | 6 | 1 | 0 |
| 5 | 0 | 0 | 2 | 5 | 6 | 3 | 1 | 6 | 6 | 1 |
| 0 | 0 | 1 | 2 | 2 | 5 | 6 | 3 | 1 | 6 | 6 |

FIG. 17

| | | | | | | | | | | |
|---|---|---|---|---|---|---|---|---|---|---|
| 2 | 5 | 6 | 7 | 4 | 2 | 7 | 7 | 2 | 0 | 0 |
| 4 | 4 | 4 | 1 | 6 | 5 | 3 | 4 | 0 | 2 | 0 |
| 6 | 4 | 2 | 5 | 1 | 4 | 2 | 0 | 2 | 5 | 0 |
| 1 | 3 | 2 | 1 | 3 | 0 | 0 | 7 | 6 | 3 | 0 |
| 1 | 3 | 2 | 1 | 3 | 0 | 0 | 7 | 6 | 3 | 0 |
| 0 | 4 | 1 | 3 | 0 | 6 | 4 | 7 | 3 | 1 | 0 |
| 7 | 4 | 6 | 0 | 2 | 3 | 1 | 3 | 4 | 3 | 0 |
| 5 | 6 | 0 | 6 | 7 | 4 | 2 | 7 | 7 | 2 | 0 |
| 4 | 0 | 2 | 7 | 6 | 1 | 6 | 5 | 3 | 4 | 0 |
| 0 | 4 | 1 | 3 | 0 | 6 | 4 | 7 | 3 | 1 | 0 |

FIG. 18

Comparative states of first shift register element 1901

| 4 | 1 | 0 | 0 | 0 | 1 | 4 | 1 | 2 | 4 | 0 |
|---|---|---|---|---|---|---|---|---|---|---|
| 1 | 0 | 0 | 4 | 0 | 0 | 1 | 4 | 1 | 2 | 4 |
| 0 | 0 | 4 | 2 | 4 | 0 | 0 | 1 | 4 | 1 | 2 |
| 0 | 4 | 2 | 1 | 2 | 4 | 0 | 0 | 1 | 4 | 1 |
| 4 | 2 | 1 | 4 | 1 | 2 | 4 | 0 | 0 | 1 | 4 |
| 2 | 1 | 4 | 1 | 4 | 1 | 2 | 4 | 0 | 0 | 1 |
| 1 | 4 | 1 | 0 | 1 | 4 | 1 | 2 | 4 | 0 | 0 |
| 4 | 1 | 0 | 0 | 0 | 1 | 4 | 1 | 2 | 4 | 0 |
| 1 | 0 | 0 | 4 | 0 | 0 | 1 | 4 | 1 | 2 | 4 |

Comparative states of second shift register element 1902

| 3 | 0 | 1 | 0 | 1 | 0 | 3 | 1 | 7 | 7 | 0 |
|---|---|---|---|---|---|---|---|---|---|---|
| 0 | 1 | 0 | 7 | 0 | 1 | 0 | 3 | 1 | 7 | 7 |
| 1 | 0 | 7 | 7 | 7 | 0 | 1 | 0 | 3 | 1 | 7 |
| 0 | 7 | 7 | 1 | 7 | 7 | 0 | 1 | 0 | 3 | 1 |
| 7 | 7 | 1 | 3 | 1 | 7 | 7 | 0 | 1 | 0 | 3 |
| 7 | 1 | 3 | 0 | 3 | 1 | 7 | 7 | 0 | 1 | 0 |
| 1 | 3 | 0 | 1 | 0 | 3 | 1 | 7 | 7 | 0 | 1 |
| 3 | 0 | 1 | 0 | 1 | 0 | 3 | 1 | 7 | 7 | 0 |
| 0 | 1 | 0 | 7 | 0 | 1 | 0 | 3 | 1 | 7 | 7 |

Comparative states of third shift register element 1903

| 5 | 0 | 0 | 1 | 0 | 0 | 5 | 1 | 5 | 6 | 1 |
|---|---|---|---|---|---|---|---|---|---|---|
| 0 | 0 | 1 | 6 | 1 | 0 | 0 | 5 | 1 | 5 | 6 |
| 0 | 1 | 6 | 5 | 6 | 1 | 0 | 0 | 5 | 1 | 5 |
| 1 | 6 | 5 | 1 | 5 | 6 | 1 | 0 | 0 | 5 | 1 |
| 6 | 5 | 1 | 5 | 1 | 5 | 6 | 1 | 0 | 0 | 5 |
| 5 | 1 | 5 | 0 | 5 | 1 | 5 | 6 | 1 | 0 | 0 |
| 1 | 5 | 0 | 0 | 0 | 5 | 1 | 5 | 6 | 1 | 0 |
| 5 | 0 | 0 | 1 | 0 | 0 | 5 | 1 | 5 | 6 | 1 |
| 0 | 0 | 1 | 6 | 1 | 0 | 0 | 5 | 1 | 5 | 6 |

FIG. 19

Matlab code for m-file ps8.m part_1_of_3

% determining the comparative coding states for 8 data symbols

%The truth tabel for sc8, addition over GF(8)
```
sc81=[0 1 2 3 4 5 6 7]+1;
sc82=[1 0 4 7 2 6 5 3]+1;
sc83=[2 4 0 5 1 3 7 6]+1;
sc84=[3 7 5 0 6 2 4 1]+1;
sc85=[4 2 1 6 0 7 3 5]+1;
sc86=[5 6 3 2 7 0 1 4]+1;
sc87=[6 5 7 4 3 1 0 2]+1;
sc88=[7 3 6 1 5 4 2 0]+1;
sc8=[sc81;sc82;sc83;sc84;sc85;sc86;sc87;sc88];
```

%The truth table for m8, multiplication over GF(8)
```
m81=[0 0 0 0 0 0 0 0]+1;
m82=[0 1 2 3 4 5 6 7]+1;
m83=[0 2 3 4 5 6 7 1]+1;
m84=[0 3 4 5 6 7 1 2]+1;
m85=[0 4 5 6 7 1 2 3]+1;
m86=[0 5 6 7 1 2 3 4]+1;
m87=[0 6 7 1 2 3 4 5]+1;
m88=[0 7 1 2 3 4 5 6]+1;
m8=[m81;m82;m83;m84;m85;m86;m87;m88];
```

% set-up of symbols in representative matrix xn
```
n=8;
inx=[2 2 2 2 2 2 2 2];
xn=ones(n,n+3);
for i=1:n
    xn(i,i+3)=inx(i);
end
```

FIG. 21A

Matlab code for m-file ps8.m part_2_of_3

```
% set-up of shift register in forward direction
shs=ones(3,n+3);
shst=ones(3,n+3,n+1);
shst(:,:,1)=shs;

% set multipliers
a6=ones(1,n+3)+5;
a5=ones(1,n+3)+4;
a8=ones(1,n+3)+3;
a7=ones(1,n+3)+6;

% determine coding states in forward direction
% expressed in shst
% sc8t and m8t solve vector addition (sc8t) and
% vector multiplication (m8t)
for i=1:n
   ins=sc8t(shs(3,:),xn(i,:));
   ins3=m8t(ins,a7);
   ins2=m8t(ins,a8);
   ins1=m8t(ins,a5);
   ts1=ins1;
   ts2=sc8t(shs(1,:),ins2);
   ts3=sc8t(shs(2,:),ins3);
   shs(3,:)=ts3;
   shs(2,:)=ts2;
   shs(1,:)=ts1;
   shst(:,:,i+1)=shs;
end
```

FIG. 21B

Matlab code for m-file ps8.m part_3_of_3
```
% set-up of shift register in reverse direction
chk=[2 2 2];
shr=ones(3,n+3);
shr(1,1)=chk(1);
shr(2,2)=chk(2);
shr(3,3)=chk(3);
shrt(:,:,n+1)=shr;

% determine coding state in reverse direction in shrt
for i=1:n
    ins=m8t(a6,shr(1,:));
    ins3=m8t(ins,a7);
    ins2=m8t(ins,a8);
    ts3=sc8t(ins,xn(n+1-i,:));
    ts2=sc8t(shr(3,:),ins3);
    ts1=sc8t(shr(2,:),ins2);
    shr(3,:)=ts3;
    shr(2,:)=ts2;
    shr(1,:)=ts1;
    shrt(:,:,n+1-i)=shr;
end % determine comparative states in resrs
for i=1:n+1
    a11=shst(1,:,i);
    a21=shrt(1,:,i);
    b11=sc8t(a11,a21);
    a12=shst(2,:,i);
    a22=shrt(2,:,i);
    b12=sc8t(a12,a22);
    a13=shst(3,:,i);
    a23=shrt(3,:,i);
    b13=sc8t(a13,a23);
    resrs(i,:)=[b11 9 b12 9 b13];
end
```

FIG. 21C

Matlab program AC8.m for finding error location

```
% actual coder to determine check symbols
shifts=[1 1 1];
%xin=[4 2 3 1 5 6 7 8];
xin=[2 2 2 2 2 2 2 2];
shiftst(1,:)=shifts;
for i =1:8
   in=sc8(shifts(3),xin(i));
   in3=m8(in,7);
   in2=m8(in,4);
   in1=m8(in,5);
   t1=in1;
   t2=sc8(shifts(1),in2);
   t3=sc8(shifts(2),in3);
   shifts(3)=t3;
   shifts(2)=t2;
   shifts(1)=t1;
   shiftst(i+1,:)=shifts;
end % ctab generated by ps8 is one shift register represented
% in resrs
% vr8t determines the actual result of the expression % create error in received codeword
cin=[shifts xin];
er=[1 1 1 1 1 1 4 6 1 1 1];
cin=sc8t(cin,er);
for i=1:9
   a1=ctab(i,:);
   b1(i)=vr8t(a1,cin);
end
```

FIG. 22

METHODS AND SYSTEMS FOR RAPID ERROR CORRECTION BY FORWARD AND REVERSE DETERMINATION OF CODING STATES

CROSS-REFERENCE TO RELATED APPLICATIONS

This application claims the benefit of U.S. Provisional Patent Application Ser. No. 61/332,974, filed May 10, 2010 which is incorporated herein by reference in its entirety.

BACKGROUND OF THE INVENTION

The present invention relates to error correcting coding and decoding. More specifically it relates to correcting symbols in error in cyclic codes.

Error correction of digital codes is widely used in telecommunications and in transfer of information such as reading of data from storage media such as optical disks. Detection of errors can take place by analyzing symbols that were added to the information symbols during coding. The relation between information symbols and the added coding symbols is determined by a rule. If after reception of the symbols such relation between the symbols as provided by the rule no longer holds, it can be determined that some of the symbols are different or in error compared to the original symbols. Such a relationship may be a parity rule or a syndrome relationship. If the errors do not exceed a certain number within a defined number of symbols it is possible to identify and correct these errors. Known methods of creating error correcting codes and correction of errors are provided by BCH codes and the related Reed-Solomon (RS) codes. These are known as (p,k) codes having codewords of p n-valued symbols of which k symbols are information symbols.

Error-correction in (p,k) codes usually involves locating symbols in error, determining the magnitude of an error and determining the correct value or state of a symbol. Calculations in (p,k) codes such as RS codes can be time and/or resource consuming and may add to a coding latency.

The inventor has described in earlier patent applications how after determining an error location in a codeword one can determine the correct symbol value without first determining an error magnitude or error value as it is also called. Also described in earlier patent applications is the up-and-down approach in determining intermediate coding states. These aspects are described in U.S. Provisional Patent Application No. 60/807,087, filed Jul. 12, 2006, and U.S. Provisional Patent Application No. 60/821,980 filed Aug. 10, 2006 which are both incorporated herein by reference in their entirety. U.S. patent application Ser. No. 11/739,189 filed Apr. 26, 2007 and U.S. patent application Ser. No. 11/743,893 filed May 3, 2007 and U.S. patent application Ser. No. 11/775,963 filed on Jul. 11, 2007 are also incorporated herein by reference in their entirety.

For instance U.S. patent application Ser. No. 11/775,963 requires the creation of a state difference matrix created from assumed symbols in error. One may write all up and down states as a state difference vector. One may further put in the position of a vector a 0 when corresponding states are identical and a 1 when corresponding states are different. One can then create a matrix formed of state difference vectors for specific error combinations. Furthermore, the vectors will be put in descending order of number of 0s in the matrix. One can easily create the vectors by inserting errors in codewords and determining the state difference vectors. A representative state difference matrix is shown in FIG. 24 of this patent application. This method can be effective in detecting errors in relatively short codewords. However, applying it to long words may create a very large matrix.

Thus, one of the most time and/or resource consuming efforts in error correction of symbols in error in a Reed-Solomon codeword, especially in a long code-word, is the determination of an error location. This creates a bottleneck in high speed decoding and error correction of received codewords in error in applications that involve high speed data transfer.

Accordingly novel methods and apparatus that can locate and correct a symbol in error in a faster or easier way are required.

SUMMARY OF THE INVENTION

One aspect of the present invention presents a novel method and apparatus that can rapidly detect and correct errors in (p,k,n) codewords with p n-state symbols of which k n-state symbols are data symbols and (p-k) symbols are check symbols, with n>2, p>2 and k>p-k, and wherein each n-state symbol is represented by a signal.

In accordance with an aspect of the present invention a method is provided for locating at least one n-state symbol in error in a plurality of signals representing a sequence of p n-state symbols wherein k n-state symbols are data symbols and (p-k) n-state symbols are check symbols, with n>2, p>2 and k≥2, comprising receiving by a processor of a plurality of signals representing the p n-state symbols, wherein k<(p-k), evaluating by the processor of at least a first expression representing a comparative state of an encoder in forward coding direction and in reverse coding direction, and wherein the expression uses a value related to a received signal that represents a single n-state symbol as an input.

In accordance with an aspect of the present invention a method is provided for error correction, comprising receiving by a receiver of a codeword of n-state symbols with n>2 containing a plurality of n-state data symbols and a plurality of n-state check symbols, an n-state symbol being represented by a signal, each check symbol being determined by an n-state expression wherein the n-state data symbols are variables, a processor determining a plurality of comparative coding states, each comparative coding state being determined by combining a related forward coding state with a related reverse coding state, the processor locating a symbol in error in the codeword based on the plurality of comparative coding states, the processor determining an error value for the symbol in error in the codeword, and the processor determining a correct state for the symbol in error.

In accordance with another aspect of the present invention a method is provided, wherein each of the comparative coding states is determined by the processor by evaluating a comparative coding expression that has the plurality of n-state data symbols and the plurality of n-state check symbols in the codeword as variables.

In accordance with yet another aspect of the present invention a method is provided, wherein a partial result of the comparative coding expression is evaluated after an n-state symbol in the codeword has been received by the receiver and before a next n-state symbol in the codeword is available for processing by the processor.

In accordance with yet another aspect of the present invention a method is provided, wherein an n-state symbol that is generated by a comparative coding expression that determines a comparative coding state is applied to determine the error value.

In accordance with yet another aspect of the present invention a method is provided, wherein no syndrome is applied to determine the error location.

In accordance with yet another aspect of the present invention a method is provided, wherein the comparative coding expression applies an n-state logic function that is defined over a finite field GF(n).

In accordance with yet another aspect of the present invention a method is provided, wherein an n-state symbol is represented by a plurality of binary signals.

In accordance with yet another aspect of the present invention a method is provided, wherein the codeword is characterized by an n-state Linear Feedback Shift Register.

In accordance with yet another aspect of the present invention a method is provided, wherein the comparative coding expression is represented by a plurality of coefficients.

In accordance with yet another aspect of the present invention a method is provided, wherein the method is implemented in a mobile communication receiver.

In accordance with an aspect of the present invention an apparatus is provided comprising, a memory to store and retrieve data, including instructions, a processor enabled to execute instructions to perform the steps: processing a codeword of n-state symbols with n>2 containing a plurality of n-state data symbols and a plurality of n-state check symbols, an n-state symbol being represented by a signal received by a receiver, each check symbol being determined by an n-state expression wherein the n-state data symbols are variables, determining a plurality of comparative coding states, each comparative coding state being determined by combining a related forward coding state with a related reverse coding state, locating a symbol in error in the codeword from the plurality of comparative coding states, determining an error value for the symbol in error; and determining a correct value for the symbol in error.

In accordance with a further aspect of the present invention an apparatus is provided, wherein each of the comparative coding states is determined by evaluating an comparative coding expression that has the plurality of n-state data symbols and the plurality of n-state check symbols in a received codeword as variables.

In accordance with yet a further aspect of the present invention an apparatus is provided, wherein a partial result of the comparative coding expression is evaluated after an n-state symbol in the codeword has been received by the receiver and before a next n-state symbol in the codeword is available for processing by the processor.

In accordance with yet a further aspect of the present invention an apparatus is provided, wherein an n-state symbol that is generated by a comparative coding expression that determines a comparative coding state is applied to determine the error value.

In accordance with yet a further aspect of the present invention an apparatus is provided, wherein no syndrome is applied to determine the error location.

In accordance with yet a further aspect of the present invention an apparatus is provided, wherein the comparative coding expression applies an n-state logic function that is defined over a finite field GF(n).

In accordance with yet a further aspect of the present invention an apparatus is provided, wherein an n-state symbol is represented by a plurality of binary words.

In accordance with yet a further aspect of the present invention an apparatus is provided, wherein the apparatus is part of a communication device.

In accordance with yet a further aspect of the present invention an apparatus is provided, wherein the apparatus is part of a mobile communication receiving device.

In accordance with yet a further aspect of the present invention an apparatus is provided, wherein the apparatus is part of a data storage device.

In accordance with yet a further aspect of the present invention an apparatus is provided, wherein the codeword is a Reed-Solomon codeword.

In accordance with yet a further aspect of the present invention the apparatus is provided, wherein n≥16.

In accordance with yet a further aspect of the present invention the apparatus is provided, wherein n>16.

It is another aspect of the present invention to provide apparatus and systems that will implement the methods provided in the present invention.

DESCRIPTION OF THE DRAWINGS

FIGS. 17 and 18 illustrate comparative coding states in accordance with an aspect of the present invention;

FIG. 19 illustrates a comparative decoding table in accordance with an aspect of the present invention;

FIGS. 21A, 21B, 21C and 22 illustrate computer code in accordance with an aspect of the present invention.

DESCRIPTION OF A PREFERRED EMBODIMENT

Figure 1:
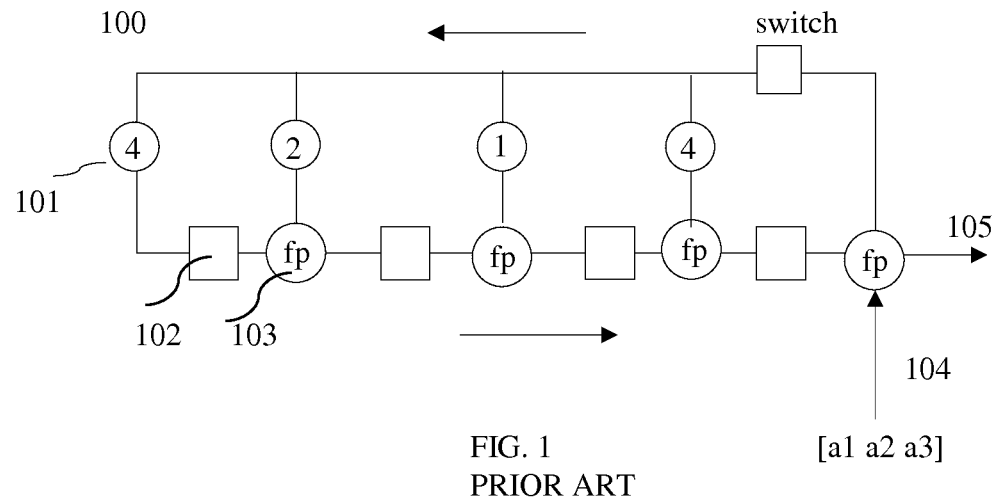
FIGS. 1-6 are examples of encoders in LFSR diagram in accordance with an aspect of the present invention.

BCH-codes and more in particular Reed-Solomon (RS) codes are among the most widely used error-correcting codes. A BCH codeword can be formed by applying a Linear Feedback Shift Register (LFSR). In general, a codeword is a systematic code. A sequence of data symbols is entered into an LFSR. A content of the shift register of the LFSR after entering the data symbols is considered to form a series of check symbols, which are concatenated to the sequence of data symbols to form a codeword.

The LFSR of a coder can be selected in a certain and pre-described way. If conditions of a BCH or RS code have been met then one may detect and correct a certain number of symbols in error in the codeword. Detection of an error in a codeword can be achieved by entering the data symbol part of the codeword in an LFSR based coder to generate the check symbols. If the newly generated check symbols are identical to the check symbols in the codeword it may be assumed that no errors have occurred. If there is a difference between the newly generated check symbols and the check symbols in the codeword then it may be assumed that an error has occurred.

The challenge is to find which of the symbols is in error, and to correct the error. In most of the cases the error correction has to take place in real-time applications. This can be in the transmission, reception and/or display of voice, audio, video or data signals. Many devices that apply error-correction such as media players and/or portable computing devices and cell phones are also power constrained. It is beneficial to achieve error correction as fast as possible at the lowest energy cost.

Error correction in BCH and RS codewords requires extensive calculations. One step involves the determination of syndrome values by substituting the roots of the generator polynomial of the code into the received message polynomial. Based on the syndrome values one can develop the error location polynomial and determine the roots of the error-location polynomial. The error locations are the reciprocals of the roots of the error polynomial. Based on the location of an error, a magnitude of the error is determined and the symbol in error is corrected with the magnitude of the error to determine the correct value (or state) of the symbol.

The mathematics of locating an error by way of an error-location polynomial is well known and is described for instance in: Error Control Coding, $2^{nd}$ edition, by Shu Lin and Daniel J. Costello Jr.; Pearson Prentice Hall 2004. A worked out example of an 8-valued (7,3) RS code using a Galois configuration LFSR is described in instance in an article by Dr. Bernard Sklar, entitled Reed Solomon codes, which is available on-line at: "http:slash-slash-www-dot-informit-dot-com-slash-content-slash-images-slash-art_sklar7_reed-solomon-slash-elementLinks-slash-art_sklar7_reed-so-lomon-dot-pdf" which is incorporated herein by reference in its entirety.

A pre-requisite for generating a codeword is the creation of an extension Galois Field that contains the symbols of the code and that is an extension of a Galois Field that is generated by a primitive polynomial. The extension field contains elements that are n-valued or n-state. An element of a binary field can have the value or state of two possible states, in general indicated as 0 and 1. In GF(n) an element can have one of n states. The states are usually indicated by consecutive digits starting at 0. For instance, one can say that GF(8) contains the elements 0, 1, 2, 3, 4, 5, 6 and 7. It is noted that an element of a Galois field can be indicated by a unique indicator, which is called a symbol. Accordingly, '0', '1', '2', '3', . . . are symbols in GF(8). A symbol in an extension field is generated from the related primitive polynomial. In general one expresses n as a power of the primitive element. For instance $8=2^3$. This also allows one to represent a symbol or element in an extension field as a plurality of primitive elements. For instance, the symbol '0' in GF(8) can be represented as '000' in primitive elements. It is noted that this is a mathematical representation.

Error correcting codes and error correcting methods and apparatus are widely applied in computing devices and communication devices and systems. Such systems and devices receive, generate and process signals rather than symbols, and do this at a speed that cannot be achieved manually by humans. For instance, voice or audio processing takes place at a speed of thousands of samples per second. A sample can be represented by a plurality of bits, wherein a bit is represented by a signal. A sample can also be represented by a signal that can assume one of n-states. A state of a signal in one embodiment can be distinguished from another state by a difference in signal value (such as amplitude). A state of a signal can also be distinguished from another state by a difference in an independent instance of a physical phenomenon, such as a wavelength of an optical signal.

Processing of n-state symbols can take place by representing each n-state symbol (with n>2) as a plurality of binary symbols that are processed by binary switching devices. In a further embodiment an n-state symbol is represented by an n-state signal and processed by n-state switching devices. In yet a further embodiment an n-state symbol is represented by a plurality of k-state symbols each represented by a k-state signals with k<n and processed by k-state switching devices.

The n-state check symbols in a BCH or RS-code are in general generated by an n-state Linear Feedback Shift Register (LFSR) based encoder or an implementation thereof. The n-state LFSR can be an actual shift register, enabled to hold and shift n-state signals or a representation of n-state symbols based on a clock signal (which is assumed but in general not shown as to not obscure the aspects of the present invention.) An n-state LFSR can be implemented in binary technology or in n-state switching technology. An n-state LFSR can also be implemented as a series of instructions on a general processor or a digital signal processor (DSP). A state of an element of an n-state LFSR can also be determined by evaluating an n-state switching expression, which will be provided herein. The term LFSR or n-state LFSR herein is intended to mean any physical implementation thereof, unless stated otherwise.

Figure 9:
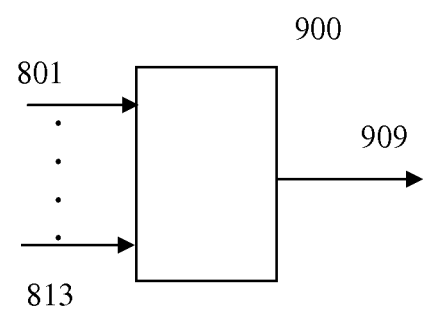

FIG. 1 is a diagram of a (7,3) 8-state Reed Solomon encoder as for instance provided in FIG. 9 of the earlier mentioned Sklar article. This encoder is provided in Galois configuration. It is noted that RS and BCH encoders can also be implemented in Fibonacci configurations, and such implementations are fully contemplated.

The encoder 100 of FIG. 1 has a 4 element 8-state shift register with 4 shift register elements of which element 102 is identified. The shift register elements are connected through a device 103 which implements a 2-input/single output function fp, which is an 8-state adder over GF(8). The feedback chains contain devices that implement single input/single output multipliers over GF(8) of which 101 which is a multiplier 4 is identified.

The following truth tables describe the 8-state function fp being an adder over GF(8).

|   |    |   |   |   | b |   |   |   |   |
|---|----|---|---|---|---|---|---|---|---|
|   | fp | 0 | 1 | 2 | 3 | 4 | 5 | 6 | 7 |
|   | 0  | 0 | 1 | 2 | 3 | 4 | 5 | 6 | 7 |
|   | 1  | 1 | 0 | 4 | 7 | 2 | 6 | 5 | 3 |
| a | 2  | 2 | 4 | 0 | 5 | 1 | 3 | 7 | 6 |
|   | 3  | 3 | 7 | 5 | 0 | 6 | 2 | 4 | 1 |
|   | 4  | 4 | 2 | 1 | 6 | 0 | 7 | 3 | 5 |
|   | 5  | 5 | 6 | 3 | 2 | 7 | 0 | 1 | 4 |
|   | 6  | 6 | 5 | 7 | 4 | 3 | 1 | 0 | 2 |
|   | 7  | 7 | 3 | 6 | 1 | 5 | 4 | 2 | 0 |

The truth table of the multiplication m8 over GF(8) is provided in the following truth table.

|   |    |   |   |   | b |   |   |   |   |
|---|----|---|---|---|---|---|---|---|---|
|   | m8 | 0 | 1 | 2 | 3 | 4 | 5 | 6 | 7 |
|   | 0  | 0 | 0 | 0 | 0 | 0 | 0 | 0 | 0 |
|   | 1  | 0 | 1 | 2 | 3 | 4 | 5 | 6 | 7 |
| a | 2  | 0 | 2 | 3 | 4 | 5 | 6 | 7 | 1 |
|   | 3  | 0 | 3 | 4 | 5 | 6 | 7 | 1 | 2 |
|   | 4  | 0 | 4 | 5 | 6 | 7 | 1 | 2 | 3 |
|   | 5  | 0 | 5 | 6 | 7 | 1 | 2 | 3 | 4 |
|   | 6  | 0 | 6 | 7 | 1 | 2 | 3 | 4 | 5 |
|   | 7  | 0 | 7 | 1 | 2 | 3 | 4 | 5 | 6 |

The advantage of the multiplier that the inverse of a multiplication (which one may call a division) is easy to establish. The inverse of multiplier 1 is itself. The inverse of multiplication by 2 is multiplication by 7; the inverse of multiplication by 3 is multiplication by 6; the inverse of multiplication by 4 is multiplication by 5. This is in line with one aspect of the present invention, wherein multipliers are considered n-state reversible inverters.

It is noted that states 0, 1, 2, 3 etc. are consecutive states in GF(8) as defined by a primitive polynomial. Accordingly, GF states like 0, 1, 2, 3 etc in binary representation are in general not conform the standard binary-to-decimal representation. By using a different primitive polynomial one can create a different adder over GF. It is noted that one may use other reversible functions instead of adders and multipliers in implementation of an encoder. However, it is beneficial to use the adders and multipliers over GF as these in general are associative and distributive, which makes it easier to evaluate the LFSR states in a reversed direction.

The encoder of FIG. 1 can be operated in different ways. The standard way is to set the content of the shift register to all 0 content, and the switch in a position so information or data symbols [a1 a2 a3] on input 104 are entered into the LFSR. After entering the three data symbols the switch is opened so no symbols (or data symbols 0, if absence of signal represents 0) are entered and the content of the shift register which are the check symbols are outputted on output 105. The 4 check symbols are concatenated to the 3 data symbols to create a 7 symbol code-word, to be transmitted ultimately to a receiver for decoding and error correction.

In accordance with a first aspect of the present invention all the intermediate states of the LFSR are determined starting from an initial state until reaching the end-state, wherein each state of each LFSR element is represented as a vector built from initial LFSR states and input signal states. The encoder as shown in FIG. 1 depends on 7 independent elements: the initial states of the shift register elements and the 3 input symbols. A state vector in this case is represented by a 7-element vector. The initial state of the first element of the shift register is 0, represented as [0 0 0 0 0 0 0]. If the initial state of the first element was 1, this would be represented as [0 0 0 1 0 0 0]. If the initial state of the first element was x, this would be represented as [0 0 0 x 0 0 0]. Sticking to x as a possible state (and realizing that x could be 0), the following representations are used:

$1^{st}$ shift register element [0 0 0 x 0 0 0];
$2^{nd}$ shift register element [0 0 0 0 x 0 0];
$3^{rd}$ shift register element [0 0 0 0 0 x 0];
$4^{th}$ shift register element [0 0 0 0 0 0 x];
first data symbol a1=[0 0 x 0 0 0 0];
second data symbol a2=[0 x 0 0 0 0 0];
first data symbol a3=[x 0 0 0 0 0 0];

While the initial state of the second shift register element is [0 0 0 x 0 0], after a clock pulse it receives and stores the content of the first register element which is modified by an input symbol which was combined with the content of the $4^{th}$ shift register element and then multiplied by a factor 2 in GF(8). One may apply the operations of addition and multiplication on the individual elements of the vector and evaluate the complete state of a shift register element by adding (by using function 'fp') all the individual elements of the state vector. It is pointed out that all the elements of the state vector are independent and that a change in one element of the vector does not change another element in the vector. It is also pointed out that a change in one element of the vector changes or may change the complete state that is represented by the vector.

It is also pointed out that one may represent an element in a vector not being 0 by a 1. This leads to a vector representing the $4^{th}$ shift register element state after entering all the data symbol as being [4 3 5 0 0 0 0]. This represents [4*a1 3*a2 5*a3 0 0 0 0] wherein a1, a2 and a3 are the 8-state data symbols for which the codeword is determined. The function '*' is the multiplication over GF(8) and '+' is the addition over GF(8). The last 4 0s in the state vector indicate that the initial state of the shift register was 0. The $4^{th}$ check symbol sr4=4*a3+3*a2+5*a1+0+0+0+0.

One can thus determine all the vectors representing the intermediate states and end state of the LFSR during encoding. All states in their state vectors for this coder are provided in the following tables.

| SR element 1 | | | | | | | |
|---|---|---|---|---|---|---|---|
| initial | 0 | 0 | 0 | 0 | 0 | 0 | 0 |
| 1 | 0 | 0 | 4 | 0 | 0 | 0 | 0 |
| 2 | 0 | 4 | 7 | 0 | 0 | 0 | 0 |
| end | 4 | 7 | 6 | 0 | 0 | 0 | 0 |

| SR element 2 | | | | | | | |
|---|---|---|---|---|---|---|---|
| initial | 0 | 0 | 0 | 0 | 0 | 0 | 0 |
| 1 | 0 | 0 | 2 | 0 | 0 | 0 | 0 |
| 2 | 0 | 2 | 7 | 0 | 0 | 0 | 0 |
| end | 2 | 7 | 5 | 0 | 0 | 0 | 0 |

| SR element 3 | | | | | | | |
|---|---|---|---|---|---|---|---|
| initial | 0 | 0 | 0 | 0 | 0 | 0 | 0 |
| 1 | 0 | 0 | 1 | 0 | 0 | 0 | 0 |
| 2 | 0 | 1 | 1 | 0 | 0 | 0 | 0 |
| end | 1 | 1 | 1 | 0 | 0 | 0 | 0 |

| SR element 4 | | | | | | | |
|---|---|---|---|---|---|---|---|
| initial | 0 | 0 | 0 | 0 | 0 | 0 | 0 |
| 1 | 0 | 0 | 4 | 0 | 0 | 0 | 0 |
| 2 | 0 | 4 | 3 | 0 | 0 | 0 | 0 |
| end | 4 | 3 | 5 | 0 | 0 | 0 | 0 |

In accordance with a further aspect of the present invention all shift register states will be determined by starting with the end state of the shift register and reversing the direction of the LFSR.

In the end state after all data symbols have been processed the end state can be represented as SR1_end=[0 0 0 x 0 0 0], SR2_end=[0 0 0 0 x0 0], SR3_end=[0 0 0 0 0 x 0] and SR4_end=[0 0 0 0 0 0 x].

Figure 2:
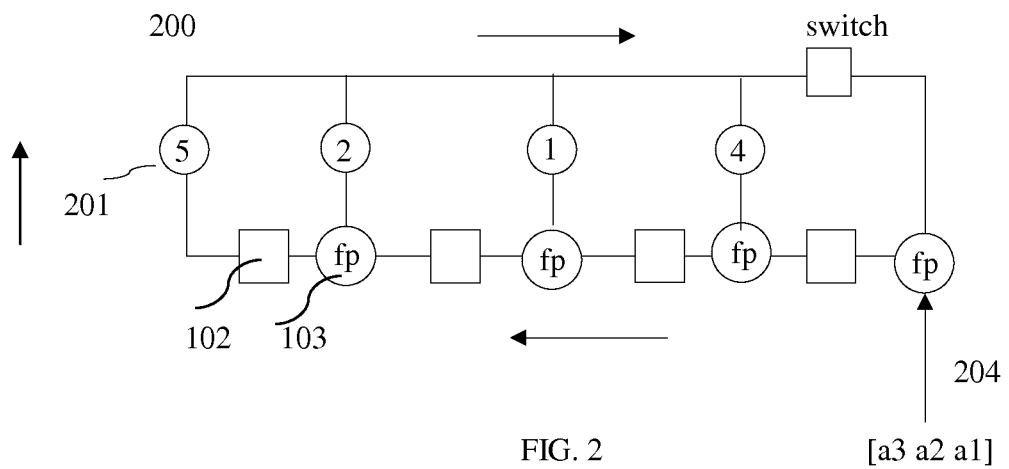

FIG. 2 shows the encoder 200 being the encoder 100 of FIG. 1 in reverse. This means that the multiplier 201 is the reverse of 101. The multiplier 5 is the reverse of multiplier 4 in GF(8). As the encoder 200 reverses the encoder 100 the input is now input 204 which is provided with [a3 a2 a1] which is the reverse of [a1 a2 a3].

The initial, end and intermediate states of the reverse encoder 200 represented as state vectors of the shift register elements are shown in the following tables.

| SR element 1 reverse | | | | | | | |
|---|---|---|---|---|---|---|---|
| initial | 0 | 0 | 0 | 4 | 7 | 6 | 1 |
| 1 | 0 | 0 | 0 | 7 | 6 | 1 | 0 |
| 2 | 0 | 0 | 0 | 6 | 1 | 0 | 0 |
| end | 0 | 0 | 0 | 1 | 0 | 0 | 0 |

| SR element 2 reverse | | | | | | | |
|---|---|---|---|---|---|---|---|
| initial | 1 | 0 | 0 | 2 | 7 | 5 | 0 |
| 1 | 0 | 0 | 0 | 7 | 5 | 0 | 1 |
| 2 | 0 | 0 | 0 | 5 | 0 | 1 | 0 |
| end | 0 | 0 | 0 | 0 | 1 | 0 | 0 |

| SR element 3 reverse | | | | | | | |
|---|---|---|---|---|---|---|---|
| initial | 0 | 1 | 0 | 1 | 1 | 1 | 0 |
| 1 | 1 | 0 | 0 | 1 | 1 | 0 | 0 |
| 2 | 0 | 0 | 0 | 1 | 0 | 0 | 1 |
| end | 0 | 0 | 0 | 0 | 0 | 1 | 0 |

| SR element 4 reverse | | | | | | | |
|---|---|---|---|---|---|---|---|
| initial | 0 | 0 | 1 | 4 | 3 | 5 | 0 |
| 1 | 0 | 1 | 0 | 3 | 5 | 0 | 0 |
| 2 | 1 | 0 | 0 | 5 | 0 | 0 | 0 |
| end | 0 | 0 | 0 | 0 | 0 | 0 | 1 |

Accordingly, one can evaluate all shift register states of the encoder in forward and in reverse direction of encoding. In the error-free situation (meaning none of the data symbols or the check symbols being in error) all states in forward and in reverse direction have to be the same. If these states are the same, then when one adds the state of a shift register in forward direction to a corresponding state in reverse direction, the result has to be zero (as 'a+a'=0 under GF(8)). As one aspect of the present invention a set of comparative state vectors is created by combining the forward and the reverse vectors of corresponding states using function 'fp'. This leads to the following set of comparative state tables.

| SR element 1 Comp | | | | | | | | |
|---|---|---|---|---|---|---|---|---|
| initial | 0 | 0 | 0 | 4 | 7 | 6 | 1 | e1 |
| 1 | 0 | 0 | 4 | 7 | 6 | 1 | 0 | e2 |
| 2 | 0 | 4 | 7 | 6 | 1 | 0 | 0 | e3 |
| end | 4 | 7 | 6 | 1 | 0 | 0 | 0 | e4 |

| SR element 2 Comp | | | | | | | | |
|---|---|---|---|---|---|---|---|---|
| initial | 1 | 0 | 0 | 2 | 7 | 5 | 0 | e5 |
| 1 | 0 | 0 | 2 | 7 | 5 | 0 | 1 | e6 |
| 2 | 0 | 2 | 7 | 5 | 0 | 1 | 0 | e7 |
| end | 2 | 7 | 5 | 0 | 1 | 0 | 0 | e8 |

| SR element 3 Comp | | | | | | | | |
|---|---|---|---|---|---|---|---|---|
| initial | 0 | 1 | 0 | 1 | 1 | 1 | 0 | e9 |
| 1 | 1 | 0 | 1 | 1 | 1 | 0 | 0 | e10 |
| 2 | 0 | 1 | 1 | 1 | 0 | 0 | 1 | e11 |
| end | 1 | 1 | 1 | 0 | 0 | 1 | 0 | e12 |

| SR element 4 Comp | | | | | | | | |
|---|---|---|---|---|---|---|---|---|
| initial | 0 | 0 | 1 | 4 | 3 | 5 | 0 | e13 |
| 1 | 0 | 1 | 4 | 3 | 5 | 0 | 0 | e14 |
| 2 | 1 | 4 | 3 | 5 | 0 | 0 | 0 | e15 |
| end | 4 | 3 | 5 | 0 | 0 | 0 | 1 | e16 |

It should be clear that each vector or row in each table represents an n-state expression of the form expr=p1*a3+p2*a2+p3*a1+p4*x1+p5*x2+p6*x3+p7*x4. As a reminder a3=[1 0 0 0 0 0 0]; x1=[0 0 0 1 0 0 0]; x2=[0 0 0 0 1 0 0]; etc. The terms p1, p2, p3, . . . etc are the coefficients in the equation as can be found in the comparative tables. If no errors are present then each expression should be 0.

A simple example is provided by the data symbols [0 0 0]. The generated codeword is [0 0 0 0 0 0 0]. Filling in the values for each symbol in the expressions related to each state will generate all 0s. This indicates that no errors were present.

This code has a disadvantage for the up-and-down method that it has many check symbols that can be in error. It does not make sense to run a decoder to only correct check symbols if all data symbols are not in error.

One may make an assumption for the error occurrence, which is that at most two adjacent symbols can be in error. This is not an unreasonable assumption. An 8-state symbol can be represented by 3 bits. A burst error may affect 3 or more bits, but never more than 6 bits. Even with 3 bits being affected, if the affected bits are in adjacent words then two symbols may be in error. One can diminish the chance for errors in adjacent symbols by interleaving symbols in different locations. However, the more symbols are interleaved the more time-consuming and the more efforts have to be made to re-assemble the codeword. It would be beneficial if one could interleave packets of 2 or more symbols and error correct 2 or more adjacent symbols in a codeword.

N-state (p,k) codes wherein k>>(p-k)

In general one appears to apply codes wherein the overall symbol error ratio is fairly small, but wherein a burst can affect a significant number of bits. For instance the well known CIRC code as used on optical disks uses 8-bit symbols wherein the expected error ratio is one in dozens of symbols. The effect of symbol errors is diminished by symbol interleaving. The challenge then becomes to quickly identify a location of an error. It turns out that the earlier provided up-down state tracking makes error location very simple. The ability to include many symbols in a (p,k) codeword may require that n in n-state is relatively large. Using Finite Field theory one arrives at certain bounds which dictate that n≥16. As examples (p,k) codes in GF(16) will be used.

The first example is a (15,11) code over GF(16) wherein add16 and mul16 are defined. This code generates a codeword of 15 16-state symbols of which 11 symbols are data symbols and 4 symbols are check symbols. The following table is the truth table for an addition over GF(16)

| add16 | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | 1 | 2 | 3 | 4 | 5 | 6 | 7 | 8 | 9 | 10 | 11 | 12 | 13 | 14 | 15 |
| 1 | 1 | 0 | 5 | 9 | 15 | 2 | 11 | 14 | 10 | 3 | 8 | 6 | 13 | 12 | 7 | 4 |
| 2 | 2 | 5 | 0 | 6 | 10 | 1 | 3 | 12 | 15 | 11 | 4 | 9 | 7 | 14 | 13 | 8 |
| 3 | 3 | 9 | 6 | 0 | 7 | 11 | 2 | 4 | 13 | 1 | 12 | 5 | 10 | 8 | 15 | 14 |
| 4 | 4 | 15 | 10 | 7 | 0 | 8 | 12 | 3 | 5 | 14 | 2 | 13 | 6 | 11 | 9 | 1 |
| 5 | 5 | 2 | 1 | 11 | 8 | 0 | 9 | 13 | 4 | 6 | 15 | 3 | 14 | 7 | 12 | 10 |
| 6 | 6 | 11 | 3 | 2 | 12 | 9 | 0 | 10 | 14 | 5 | 7 | 1 | 4 | 15 | 8 | 13 |
| 7 | 7 | 14 | 12 | 4 | 3 | 13 | 10 | 0 | 11 | 15 | 6 | 8 | 2 | 5 | 1 | 9 |
| 8 | 8 | 10 | 15 | 13 | 5 | 4 | 14 | 11 | 0 | 12 | 1 | 7 | 9 | 3 | 6 | 2 |
| 9 | 9 | 3 | 11 | 1 | 14 | 6 | 5 | 15 | 12 | 0 | 13 | 2 | 8 | 10 | 4 | 7 |
| 10 | 10 | 8 | 4 | 12 | 2 | 15 | 7 | 6 | 1 | 13 | 0 | 14 | 3 | 9 | 11 | 5 |
| 11 | 11 | 6 | 9 | 5 | 13 | 3 | 1 | 8 | 7 | 2 | 14 | 0 | 15 | 4 | 10 | 12 |
| 12 | 12 | 13 | 7 | 10 | 6 | 14 | 4 | 2 | 9 | 8 | 3 | 15 | 0 | 1 | 5 | 11 |
| 13 | 13 | 12 | 14 | 8 | 11 | 7 | 15 | 5 | 3 | 10 | 9 | 4 | 1 | 0 | 2 | 6 |
| 14 | 14 | 7 | 13 | 15 | 9 | 12 | 8 | 1 | 6 | 4 | 11 | 10 | 5 | 2 | 0 | 3 |
| 15 | 15 | 4 | 8 | 14 | 1 | 10 | 13 | 9 | 2 | 7 | 5 | 12 | 11 | 6 | 3 | 0 |

The following table provides a truth table for a multiplication over GF(16).

| mul16 | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 1 | 2 | 3 | 4 | 5 | 6 | 7 | 8 | 9 | 10 | 11 | 12 | 13 | 14 | 15 |
| 2 | 0 | 2 | 3 | 4 | 5 | 6 | 7 | 8 | 9 | 10 | 11 | 12 | 13 | 14 | 15 | 1 |
| 3 | 0 | 3 | 4 | 5 | 6 | 7 | 8 | 9 | 10 | 11 | 12 | 13 | 14 | 15 | 1 | 2 |
| 4 | 0 | 4 | 5 | 6 | 7 | 8 | 9 | 10 | 11 | 12 | 13 | 14 | 15 | 1 | 2 | 3 |
| 5 | 0 | 5 | 6 | 7 | 8 | 9 | 10 | 11 | 12 | 13 | 14 | 15 | 1 | 2 | 3 | 4 |
| 6 | 0 | 6 | 7 | 8 | 9 | 10 | 11 | 12 | 13 | 14 | 15 | 1 | 2 | 3 | 4 | 5 |
| 7 | 0 | 7 | 8 | 9 | 10 | 11 | 12 | 13 | 14 | 15 | 1 | 2 | 3 | 4 | 5 | 6 |
| 8 | 0 | 8 | 9 | 10 | 11 | 12 | 13 | 14 | 15 | 1 | 2 | 3 | 4 | 5 | 6 | 7 |
| 9 | 0 | 9 | 10 | 11 | 12 | 13 | 14 | 15 | 1 | 2 | 3 | 4 | 5 | 6 | 7 | 8 |
| 10 | 0 | 10 | 11 | 12 | 13 | 14 | 15 | 1 | 2 | 3 | 4 | 5 | 6 | 7 | 8 | 9 |
| 11 | 0 | 11 | 12 | 13 | 14 | 15 | 1 | 2 | 3 | 4 | 5 | 6 | 7 | 8 | 9 | 10 |
| 12 | 0 | 12 | 13 | 14 | 15 | 1 | 2 | 3 | 4 | 5 | 6 | 7 | 8 | 9 | 10 | 11 |
| 13 | 0 | 13 | 14 | 15 | 1 | 2 | 3 | 4 | 5 | 6 | 7 | 8 | 9 | 10 | 11 | 12 |
| 14 | 0 | 14 | 15 | 1 | 2 | 3 | 4 | 5 | 6 | 7 | 8 | 9 | 10 | 11 | 12 | 13 |
| 15 | 0 | 15 | 1 | 2 | 3 | 4 | 5 | 6 | 7 | 8 | 9 | 10 | 11 | 12 | 13 | 14 |

Figure 3:
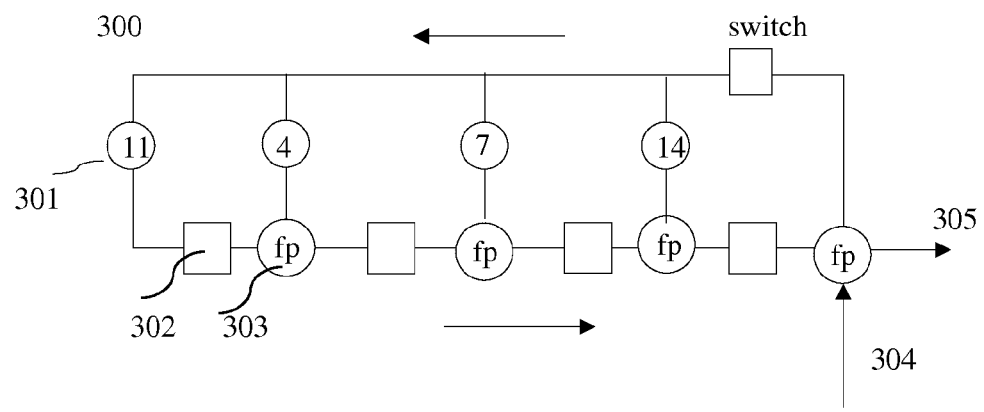

A diagram of a (15,11) encoder is shown in FIG. 3. There are different ways to construct the encoder. One way is to assume the symbols a, $a^2$, $a^3$ and $a^4$ to be roots of the generating polynomial of the encoder. This leads to $(X-a)*(X-a^2)*(X-a^3)*(X-a^4)$ which can be evaluated to $g(X)=X^4+14X^3+7X^2+4X+11$. A diagram of the 16-state (15,11) encoder 300 corresponding to this polynomial is provided in FIG. 3. One 16-state multiplier 11 is identified as device 301. The 16-state LFSR has 4 16-state shift register elements, of which one is identified as 303 in FIG. 3. The devices fp implement the 16-state adder over GF(16) add16 as provided above. All multipliers implement inverters as provided by function mul16 as provided above. The 11 16-state data symbols are provided on input 304 after which the switch prevents further entry of data symbols and the content of the 4 shift register elements can be shifted out on 305. The initial state of the shift register is [0 0 0 0].

Figure 4:
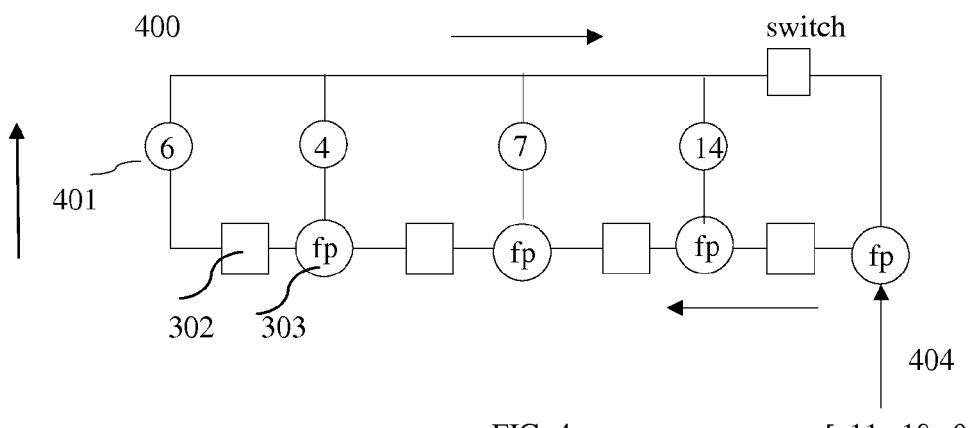

FIG. 4 shows the encoder in reverse mode, starting with as initial state of the shift register the obtained (or received) check symbols. The multiplier 301 has been reversed to a multiplier 401 being multiplier 6, and the input 404 receives the data symbols in reverse order.

The approach for generating the going-up states of the LFSR and the reversing direction states in this (15,11) 16-state code is similar as explained above in the (7,3) 8-state code. Each state is represented by a vector of 15 elements. Herein 11 positions are dedicated to the data symbols. The first 16-state data symbol entered in forward direction is [1 0 0 0 0 0 0 0 0 0 0 0 0 0 0]. The second data symbol is represented as [0 1 0 0 0 0 0 0 0 0 0 0 0 0 0]. The 11$^{th}$ 16-state data symbol is represented as [0 0 0 0 0 0 0 0 0 0 1 0 0 0 0]. The initial state of the shift register is generally 0. However, after all 11 16-state data symbols have been processed the state of the first shift register element is assumed to be [0 0 0 0 0 0 0 0 0 0 1 0 0 0]; and of the fourth shift register element is [0 0 0 0 0 0 0 0 0 0 0 0 0 0 1]. Other states follow the same convention as explained.

One can now express all forward going intermediate and final states of the LFSR of FIG. 3 by executing the relevant additions and multiplications on the vectors. The initial states herein are all 0.

The following table shows the vector states of the first shift register element from the initial state until the final state (which represents a check symbol) generated in forward direction.

| moment | States of 1ˢᵗ shift register element after entering data symbol | | | | | | | | | | | | | | |
|---|---|---|---|---|---|---|---|---|---|---|---|---|---|---|---|
| initial | 0 | 0 | 0 | 0 | 0 | 0 | 0 | 0 | 0 | 0 | 0 | 0 | 0 | 0 | 0 |
| 1 | 11 | 0 | 0 | 0 | 0 | 0 | 0 | 0 | 0 | 0 | 0 | 0 | 0 | 0 | 0 |
| 2 | 9 | 11 | 0 | 0 | 0 | 0 | 0 | 0 | 0 | 0 | 0 | 0 | 0 | 0 | 0 |
| 3 | 12 | 9 | 11 | 0 | 0 | 0 | 0 | 0 | 0 | 0 | 0 | 0 | 0 | 0 | 0 |
| 4 | 12 | 12 | 9 | 11 | 0 | 0 | 0 | 0 | 0 | 0 | 0 | 0 | 0 | 0 | 0 |
| 5 | 6 | 12 | 12 | 9 | 11 | 0 | 0 | 0 | 0 | 0 | 0 | 0 | 0 | 0 | 0 |
| 6 | 14 | 6 | 12 | 12 | 9 | 11 | 0 | 0 | 0 | 0 | 0 | 0 | 0 | 0 | 0 |
| 7 | 9 | 14 | 6 | 12 | 12 | 9 | 11 | 0 | 0 | 0 | 0 | 0 | 0 | 0 | 0 |
| 8 | 6 | 9 | 14 | 6 | 12 | 12 | 9 | 11 | 0 | 0 | 0 | 0 | 0 | 0 | 0 |
| 9 | 2 | 6 | 9 | 14 | 6 | 12 | 12 | 9 | 11 | 0 | 0 | 0 | 0 | 0 | 0 |
| 10 | 7 | 2 | 6 | 9 | 14 | 6 | 12 | 12 | 9 | 11 | 0 | 0 | 0 | 0 | 0 |
| 11 - end | 9 | 7 | 2 | 6 | 9 | 14 | 6 | 12 | 12 | 9 | 11 | 0 | 0 | 0 | 0 |

The following table shows the vector states of the first shift register element from the initial state until the final state (which represents a check symbol) generated in reverse direction, starting with [0 0 0 0 0 0 0 0 0 0 0 1 0 0 0] at moment 11, related to the coder of FIG. 4.

| moment | States of 1ˢᵗ shift register element after entering data symbol in reverse | | | | | | | | | | | | | | |
|---|---|---|---|---|---|---|---|---|---|---|---|---|---|---|---|
| end | 0 | 0 | 0 | 1 | 9 | 7 | 2 | 6 | 9 | 14 | 6 | 11 | 9 | 12 | 12 |
| 1 | 0 | 0 | 0 | 0 | 1 | 9 | 7 | 2 | 6 | 9 | 14 | 9 | 12 | 12 | 6 |
| 2 | 0 | 0 | 0 | 0 | 0 | 1 | 9 | 7 | 2 | 6 | 9 | 12 | 12 | 6 | 14 |
| 3 | 0 | 0 | 0 | 0 | 0 | 0 | 1 | 9 | 7 | 2 | 6 | 12 | 6 | 14 | 9 |
| 4 | 0 | 0 | 0 | 0 | 0 | 0 | 0 | 1 | 9 | 7 | 2 | 6 | 14 | 9 | 6 |
| 5 | 0 | 0 | 0 | 0 | 0 | 0 | 0 | 0 | 1 | 9 | 7 | 14 | 9 | 6 | 2 |
| 6 | 0 | 0 | 0 | 0 | 0 | 0 | 0 | 0 | 0 | 1 | 9 | 9 | 6 | 2 | 7 |
| 7 | 0 | 0 | 0 | 0 | 0 | 0 | 0 | 0 | 0 | 0 | 1 | 6 | 2 | 7 | 9 |
| 8 | 0 | 0 | 0 | 0 | 0 | 0 | 0 | 0 | 0 | 0 | 2 | 7 | 9 | 1 | |
| 9 | 0 | 0 | 0 | 0 | 0 | 0 | 0 | 0 | 0 | 0 | 0 | 7 | 9 | 1 | 0 |
| 10 | 0 | 0 | 0 | 0 | 0 | 0 | 0 | 0 | 0 | 0 | 0 | 9 | 1 | 0 | 0 |
| 11 - initial | 0 | 0 | 0 | 0 | 0 | 0 | 0 | 0 | 0 | 0 | 0 | 1 | 0 | 0 | 0 |

One can also generate the state matrix in forward and reverse direction for the other shift register elements.

In a next step the corresponding state in forward and reverse direction are added over GF(16) with the above provided add16 function. Because each position in a state is independent of other positions the addition is achieved by add16 addition of individual positions in a vector with the individual position in the corresponding vector. This leads to a matrix of comparative state vectors. The four comparative vectors for this coder are shown in the following tables.

For the First Shift Register

| moment | Comparative States of 1ˢᵗ shift register element | | | | | | | | | | | | | | |
|---|---|---|---|---|---|---|---|---|---|---|---|---|---|---|---|
| end | 0 | 0 | 0 | 1 | 9 | 7 | 2 | 6 | 9 | 14 | 6 | 11 | 9 | 12 | 12 |
| 1 | 11 | 0 | 0 | 0 | 1 | 9 | 7 | 2 | 6 | 9 | 14 | 9 | 12 | 12 | 6 |
| 2 | 9 | 11 | 0 | 0 | 0 | 1 | 9 | 7 | 2 | 6 | 9 | 12 | 12 | 6 | 14 |
| 3 | 12 | 9 | 11 | 0 | 0 | 0 | 1 | 9 | 7 | 2 | 6 | 12 | 6 | 14 | 9 |
| 4 | 12 | 12 | 9 | 11 | 0 | 0 | 0 | 1 | 9 | 7 | 2 | 6 | 14 | 9 | 6 |
| 5 | 6 | 12 | 12 | 9 | 11 | 0 | 0 | 0 | 1 | 9 | 7 | 14 | 9 | 6 | 2 |
| 6 | 14 | 6 | 12 | 12 | 9 | 11 | 0 | 0 | 0 | 1 | 9 | 9 | 6 | 2 | 7 |
| 7 | 9 | 14 | 6 | 12 | 12 | 9 | 11 | 0 | 0 | 0 | 1 | 6 | 2 | 7 | 9 |
| 8 | 6 | 9 | 14 | 6 | 12 | 12 | 9 | 11 | 0 | 0 | 0 | 2 | 7 | 9 | 1 |
| 9 | 2 | 6 | 9 | 14 | 6 | 12 | 12 | 9 | 11 | 0 | 0 | 7 | 9 | 1 | 0 |
| 10 | 7 | 2 | 6 | 9 | 14 | 6 | 12 | 12 | 9 | 11 | 0 | 9 | 1 | 0 | 0 |
| 11 - initial | 9 | 7 | 2 | 6 | 9 | 14 | 6 | 12 | 12 | 9 | 11 | 1 | 0 | 0 | 0 |

For the Second Shift Register

| moment | Comparative States of $2^{nd}$ shift register element | | | | | | | | | | | | | | |
|---|---|---|---|---|---|---|---|---|---|---|---|---|---|---|---|
| initial | 0 | 0 | 1 | 0 | 12 | 8 | 7 | 4 | 13 | 10 | 5 | 4 | 9 | 6 | 14 |
| 1 | 4 | 0 | 0 | 1 | 0 | 12 | 8 | 7 | 4 | 13 | 10 | 9 | 6 | 14 | 5 |
| 2 | 9 | 4 | 0 | 0 | 1 | 0 | 12 | 8 | 7 | 4 | 13 | 6 | 14 | 5 | 10 |
| 3 | 6 | 9 | 4 | 0 | 0 | 1 | 0 | 12 | 8 | 7 | 4 | 14 | 5 | 10 | 13 |
| 4 | 14 | 6 | 9 | 4 | 0 | 0 | 1 | 0 | 12 | 8 | 7 | 5 | 10 | 13 | 4 |
| 5 | 5 | 14 | 6 | 9 | 4 | 0 | 0 | 1 | 0 | 12 | 8 | 10 | 13 | 4 | 7 |
| 6 | 10 | 5 | 14 | 6 | 9 | 4 | 0 | 0 | 1 | 0 | 12 | 13 | 4 | 7 | 8 |
| 7 | 13 | 10 | 5 | 14 | 6 | 9 | 4 | 0 | 0 | 1 | 0 | 4 | 7 | 8 | 12 |
| 8 | 4 | 13 | 10 | 5 | 14 | 6 | 9 | 4 | 0 | 0 | 1 | 7 | 8 | 12 | 0 |
| 9 | 7 | 4 | 13 | 10 | 5 | 14 | 6 | 9 | 4 | 0 | 0 | 8 | 12 | 0 | 1 |
| 10 | 8 | 7 | 4 | 13 | 10 | 5 | 14 | 6 | 9 | 4 | 0 | 12 | 0 | 1 | 0 |
| 11 - end | 12 | 8 | 7 | 4 | 13 | 10 | 5 | 14 | 6 | 9 | 4 | 0 | 1 | 0 | 0 |

For the Third Shift Register

| moment | Comparative States of $3^{rd}$ shift register element | | | | | | | | | | | | | | |
|---|---|---|---|---|---|---|---|---|---|---|---|---|---|---|---|
| initial | 0 | 1 | 0 | 0 | 4 | 4 | 11 | 14 | 15 | 15 | 13 | 7 | 8 | 12 | 14 |
| 1 | 7 | 0 | 1 | 0 | 0 | 4 | 4 | 11 | 14 | 15 | 15 | 8 | 12 | 14 | 13 |
| 2 | 8 | 7 | 0 | 1 | 0 | 0 | 4 | 4 | 11 | 14 | 15 | 12 | 14 | 13 | 15 |
| 3 | 12 | 8 | 7 | 0 | 1 | 0 | 0 | 4 | 4 | 11 | 14 | 14 | 13 | 15 | 15 |
| 4 | 14 | 12 | 8 | 7 | 0 | 1 | 0 | 0 | 4 | 4 | 11 | 13 | 15 | 15 | 14 |
| 5 | 13 | 14 | 12 | 8 | 7 | 0 | 1 | 0 | 0 | 4 | 4 | 15 | 15 | 14 | 11 |
| 6 | 15 | 13 | 14 | 12 | 8 | 7 | 0 | 1 | 0 | 0 | 4 | 15 | 14 | 11 | 4 |
| 7 | 15 | 15 | 13 | 14 | 12 | 8 | 7 | 0 | 1 | 0 | 0 | 14 | 11 | 4 | 4 |
| 8 | 14 | 15 | 15 | 13 | 14 | 12 | 8 | 7 | 0 | 1 | 0 | 11 | 4 | 4 | 0 |
| 9 | 11 | 14 | 15 | 15 | 13 | 14 | 12 | 8 | 7 | 0 | 1 | 4 | 4 | 0 | 0 |
| 10 | 4 | 11 | 14 | 15 | 15 | 13 | 14 | 12 | 8 | 7 | 0 | 4 | 0 | 0 | 1 |
| 11 - end | 4 | 4 | 11 | 14 | 15 | 15 | 13 | 14 | 12 | 8 | 7 | 0 | 0 | 1 | 0 |

For the Fourth Shift Register

| moment | Comparative States of $4^{th}$ shift register element | | | | | | | | | | | | | | |
|---|---|---|---|---|---|---|---|---|---|---|---|---|---|---|---|
| initial | 1 | 0 | 0 | 0 | 6 | 14 | 12 | 7 | 11 | 14 | 4 | 14 | 2 | 2 | 11 |
| 1 | 14 | 1 | 0 | 0 | 0 | 6 | 14 | 12 | 7 | 11 | 14 | 2 | 2 | 11 | 4 |
| 2 | 2 | 14 | 1 | 0 | 0 | 0 | 6 | 14 | 12 | 7 | 11 | 2 | 11 | 4 | 14 |
| 3 | 2 | 2 | 14 | 1 | 0 | 0 | 0 | 6 | 14 | 12 | 7 | 11 | 4 | 14 | 11 |
| 4 | 11 | 2 | 2 | 14 | 1 | 0 | 0 | 0 | 6 | 14 | 12 | 4 | 14 | 11 | 7 |
| 5 | 4 | 11 | 2 | 2 | 14 | 1 | 0 | 0 | 0 | 6 | 14 | 14 | 11 | 7 | 12 |
| 6 | 14 | 4 | 11 | 2 | 2 | 14 | 1 | 0 | 0 | 0 | 6 | 11 | 7 | 12 | 14 |
| 7 | 11 | 14 | 4 | 11 | 2 | 2 | 14 | 1 | 0 | 0 | 0 | 7 | 12 | 14 | 6 |
| 8 | 7 | 11 | 14 | 4 | 11 | 2 | 2 | 14 | 1 | 0 | 0 | 12 | 14 | 6 | 0 |
| 9 | 12 | 7 | 11 | 14 | 4 | 11 | 2 | 2 | 14 | 1 | 0 | 14 | 6 | 0 | 0 |
| 10 | 14 | 12 | 7 | 11 | 14 | 4 | 11 | 2 | 2 | 14 | 1 | 6 | 0 | 0 | 0 |
| 11 - end | 6 | 14 | 12 | 7 | 11 | 14 | 4 | 11 | 2 | 2 | 14 | 0 | 0 | 0 | 1 |

As a reminder: the vector [p1 p2 p3 p4 p5 p6 p7 p8 p9 p10 p11 p12 p13 p14 p15] establishes an expression: Ex=p1*a1+ p2*a2+p3*a3+p4*a4+p5*a5+p6*a6+p7*a7+p8*a8+p9*a9+ p10*a10+p11*a11+p12*x1+p13*x2+p14*x3+p15*x4. Herein [a1 a2 a3 ... a11] are the data symbols and x1, x2, x3 and x4 are states of shift registers 1, 2, 3 and 4 respectively. If no errors have occurred then all the expressions established by the comparative states must be zero.

One can see that the line of moment 11 in each of the comparative matrices establishes the appropriate check symbol for each shift register element. For instance, line 11 in the fourth matrix expresses 6a1+14a2+12a3+7a4+11a5+14a6+ 4a7+11a8+2a9+2a10+14a11+x4=0. Thus, x4, the fourth check symbol can be evaluated by x4=6a1+14a2+12a3+7a4+ 11a5+14a6+4a7+11a8+2a9+2a10+14a11+x4. Keeping in mind that '+' and '−' in GF(16) are identical operations.

The sequence of 11 data symbols [0 0 0 0 0 0 0 0 0 0 0] will generate check symbols [0 0 0 0]. The sequence [2 3 4 5 0 0 8 10 11 12 14] will generate check symbols [9 1 5 4]. By applying the reversing coder of FIG. 4 starting with shift register [9 1 5 4] and entering the data symbols in reverse order, one will arrive at an initial state [0 0 0 0].

The matrices reflect the imposed delay of a state to traverse the complete shift register. This is a causal effect, as a state cannot be generated before its cause has occurred. This is reflected in the zeros of the vector.

The above matrices provide a very simple way and extremely fast way to determine an error location, especially for up to 3 adjacent errors. Error locations can be found by filling in all equations, for instance in one or more comparative matrix, with received values of data symbols and of received check symbols. In a first step one may re-calculate the check symbols to check if errors have occurred.

The above tables offer the opportunity to correct up to 3 adjacent errors. By filling in the values of the received symbols, and assuming that all multiple errors are adjacent errors, the expressions with 0 at the location of an error will of course not include the value of the error into the expression. This means that the expressions with coefficient 0 at the location of the symbols in error will create a value 0. This is because the expression will be 0 if no errors have occurred. Thus, when an expression only contains correct symbols, the expression will be 0. However, the occurrence of multiple errors may also create a value 0. This means that one has to exclude some potential wrong decisions.

Figure 5:
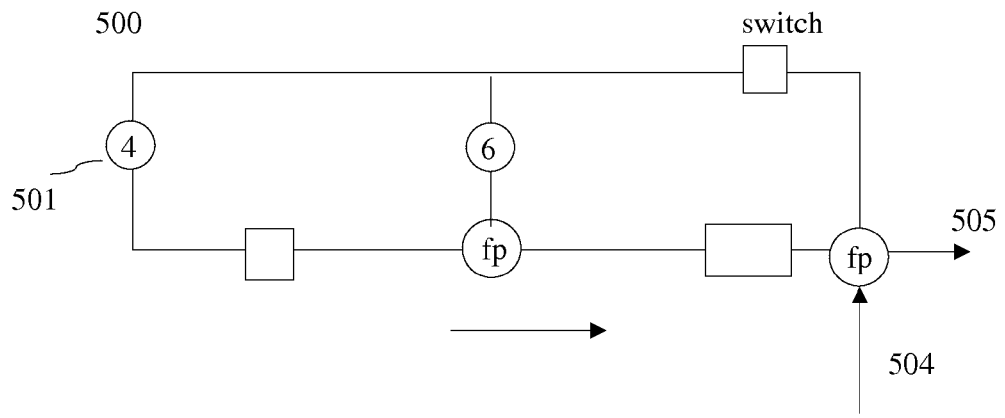
Figure 6:
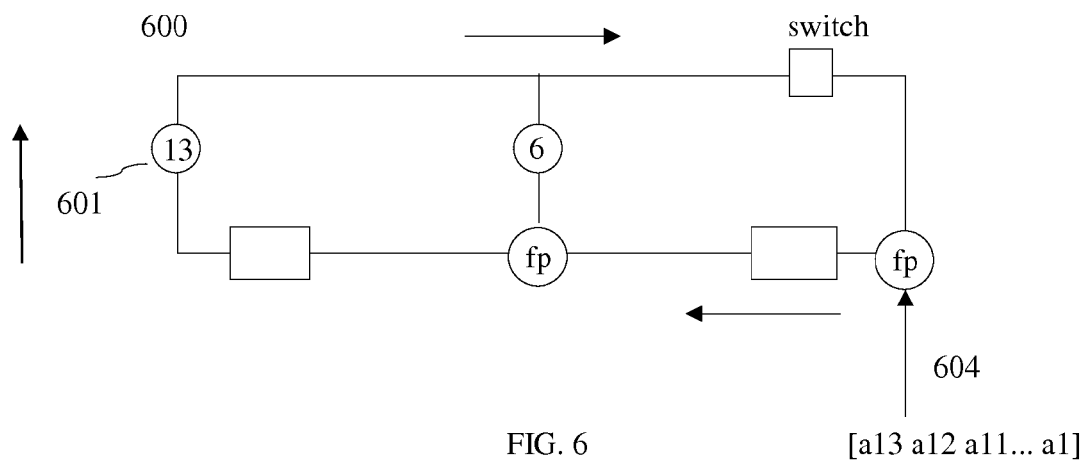

Clearly, the simplest situation is wherein just one error occurs. For that situation one needs only 2 check symbols. The forward 16-state coder 500 to generate 2 check 16-state symbols is shown in FIG. 5 as a 16-state LFSR with two shift register elements and two multipliers of which one multiplier in 501 is a multiplier 4 over GF(16) and a multiplier 6. The data symbols are inputted in forward direction on input 504 and the check symbols can be read on output 505 after the switch has been opened. FIG. 6 shows the reversing coder 600 corresponding to 500. The multiplier 601 (which reverses 501) is thus multiplier 13 over GF(16). For illustrative purpose, the generated code is a (15,13) code, with 13 n-state symbols. The 13 data symbols are provided in reverse order on input 604. One may shorten the code by inserting zeros.

It should be noted that the LFSRs are provided to illustrate the process of generating intermediate states. One may actually implement an LFSR. However, it should be clear that all states are deterministic. One may determine these states by evaluating the appropriate n-state expressions. This means that, if concurrent or parallel processors are provided, one may evaluate all states concurrently or almost concurrently, by using known initial states and the input data symbols. The states of the LFSR can be evaluated consecutively or concurrently by a processor or by parallel processors, respectively.

The process as applied before may be applied herein again to generate a comparative matrix for the up-and-down states for each of the two shift register elements.

The following table provides the comparative matrix for all 14 forward and reverse states of the first shift register element (the first row indicates the initial state, the last row is the check symbol state and also corresponds to the initial state for the reversing coder).

| moment | Comparative States of $1^{st}$ shift register element | | | | | | | | | | | | | |
|---|---|---|---|---|---|---|---|---|---|---|---|---|---|---|
| initial-start | 0 | 1 | 3 | 7 | 7 | 14 | 15 | 9 | 15 | 3 | 14 | 4 | 1 | 4 | 9 |
| 1 | 4 | 0 | 1 | 3 | 7 | 7 | 14 | 15 | 9 | 15 | 3 | 14 | 4 | 9 | 1 |
| 2 | 9 | 4 | 0 | 1 | 3 | 7 | 7 | 14 | 15 | 9 | 15 | 3 | 14 | 1 | 4 |
| 3 | 1 | 9 | 4 | 0 | 1 | 3 | 7 | 7 | 14 | 15 | 9 | 15 | 3 | 4 | 14 |
| 4 | 4 | 1 | 9 | 4 | 0 | 1 | 3 | 7 | 7 | 14 | 15 | 9 | 15 | 14 | 3 |
| 5 | 14 | 4 | 1 | 9 | 4 | 0 | 1 | 3 | 7 | 7 | 14 | 15 | 9 | 3 | 15 |
| 6 | 3 | 14 | 4 | 1 | 9 | 4 | 0 | 1 | 3 | 7 | 7 | 14 | 15 | 15 | 9 |
| 7 | 15 | 3 | 14 | 4 | 1 | 9 | 4 | 0 | 1 | 3 | 7 | 7 | 14 | 9 | 15 |
| 8 | 9 | 15 | 3 | 14 | 4 | 1 | 9 | 4 | 0 | 1 | 3 | 7 | 7 | 15 | 14 |
| 9 | 15 | 9 | 15 | 3 | 14 | 4 | 1 | 9 | 4 | 0 | 1 | 3 | 7 | 14 | 7 |
| 10 | 14 | 15 | 9 | 15 | 3 | 14 | 4 | 1 | 9 | 4 | 0 | 1 | 3 | 7 | 7 |
| 11 | 7 | 14 | 15 | 9 | 15 | 3 | 14 | 4 | 1 | 9 | 4 | 0 | 1 | 7 | 3 |
| 12 | 7 | 7 | 14 | 15 | 9 | 15 | 3 | 14 | 4 | 1 | 9 | 4 | 0 | 3 | 1 |
| initial-end | 3 | 7 | 7 | 14 | 15 | 9 | 15 | 3 | 14 | 4 | 1 | 9 | 4 | 1 | 0 |

The following table provides the comparative matrix for all 14 forward and reverse states of the second shift register element (the first row indicates the initial state, the last row is the check symbol state and also corresponds to the initial state for the reversing coder).

| moment | Comparative States of $2^{nd}$ shift register element | | | | | | | | | | | | | |
|---|---|---|---|---|---|---|---|---|---|---|---|---|---|---|
| initial-start | 1 | 0 | 13 | 15 | 4 | 4 | 11 | 12 | 6 | 12 | 15 | 11 | 1 | 6 | 13 |
| 1 | 6 | 1 | 0 | 13 | 15 | 4 | 4 | 11 | 12 | 6 | 12 | 15 | 11 | 13 | 1 |
| 2 | 13 | 6 | 1 | 0 | 13 | 15 | 4 | 4 | 11 | 12 | 6 | 12 | 15 | 1 | 11 |
| 3 | 1 | 13 | 6 | 1 | 0 | 13 | 15 | 4 | 4 | 11 | 12 | 6 | 12 | 11 | 15 |
| 4 | 11 | 1 | 13 | 6 | 1 | 0 | 13 | 15 | 4 | 4 | 11 | 12 | 6 | 15 | 12 |
| 5 | 15 | 11 | 1 | 13 | 6 | 1 | 0 | 13 | 15 | 4 | 4 | 11 | 12 | 12 | 6 |
| 6 | 12 | 15 | 11 | 1 | 13 | 6 | 1 | 0 | 13 | 15 | 4 | 4 | 11 | 6 | 12 |
| 7 | 6 | 12 | 15 | 11 | 1 | 13 | 6 | 1 | 0 | 13 | 15 | 4 | 4 | 12 | 11 |
| 8 | 12 | 6 | 12 | 15 | 11 | 1 | 13 | 6 | 1 | 0 | 13 | 15 | 4 | 11 | 4 |
| 9 | 11 | 12 | 6 | 12 | 15 | 11 | 1 | 13 | 6 | 1 | 0 | 13 | 15 | 4 | 4 |
| 10 | 4 | 11 | 12 | 6 | 12 | 15 | 11 | 1 | 13 | 6 | 1 | 0 | 13 | 4 | 15 |
| 11 | 4 | 4 | 11 | 12 | 6 | 12 | 15 | 11 | 1 | 13 | 6 | 1 | 0 | 15 | 13 |
| 12 | 15 | 4 | 4 | 11 | 12 | 6 | 12 | 15 | 11 | 1 | 13 | 6 | 1 | 13 | 0 |
| initial-end | 13 | 15 | 4 | 4 | 11 | 12 | 6 | 12 | 15 | 11 | 1 | 13 | 6 | 0 | 1 |

One can check the error locating process with some examples.

As a first example one may provide the coders with 13 16-state symbols 0. This will generate the check symbols [0 0]. Entering the 15 symbol codeword into the expressions defined by the rows of the matrices creates:

| moment | expressions_matrix1 | expressions_matrix2 |
|---|---|---|
| initial-start | 0 | 0 |
| 1 | 0 | 0 |
| 2 | 0 | 0 |
| 3 | 0 | 0 |
| 4 | 0 | 0 |
| 5 | 0 | 0 |
| 6 | 0 | 0 |
| 7 | 0 | 0 |
| 8 | 0 | 0 |
| 9 | 0 | 0 |
| 10 | 0 | 0 |
| 11 | 0 | 0 |
| 12 | 0 | 0 |
| initial-end | 0 | 0 |

This shows that no error has occurred.

As a second example the 13 symbol data word [0 0 0 0 0 0 13 0 0 0 0 0 0] can be entered to generate the codeword with check symbols [0 0 0 0 0 0 13 0 0 0 0 0 0 12 3]. Assume that an error has occurred and the codeword [0 0 0 0 0 0 0 0 0 0 0 0 0 12 3] has been received. The following table shows the results of the expressions by filling in the received symbol values.

| moment | expressions_matrix1 | expressions_matrix2 |
|---|---|---|
| initial-start | 12 | 8 |
| 1 | 11 | 1 |
| 2 | 4 | 1 |
| 3 | 4 | 12 |
| 4 | 15 | 10 |
| 5 | 13 | 0 |
| 6 | 0 | 13 |
| 7 | 1 | 3 |
| 8 | 6 | 10 |
| 9 | 13 | 13 |
| 10 | 1 | 8 |
| 11 | 11 | 12 |
| 12 | 15 | 9 |
| initial-end | 12 | 3 |

The expression of row 6 in the first shift register matrix and in row 5 of the second shift register matrix generates a 0. This corresponds with the seventh symbol in the codeword, which is determined to be in error.

Accordingly, the error location process has been reduced to evaluating a set of simple expressions. The row in the matrix that is 0 has the error. Each row has one symbol that does not contribute to the value of the expression, which then is the symbol in error if all other expressions are not 0. This means that an error location can be determined very, very fast, especially if the expressions are evaluated in parallel.

The matrix also offers the opportunity to immediately determine the correct value of a symbol in error. One can achieve this by associating a row with a symbol in error with a row in a matrix wherein the error contributes to the value of the expression. For instance when an error has occurred in row 6 one may associate the solution with row 9. Row 9 has the vector [15 9 15 3 14 4 1 9 4 0 1 3 7 14 7], which is the expression $15a1+9a2+15a3+3a4+14a5+4a6+a7+9a8+4a9+0+a11+3a12+7a13+14x1+7x2$. Herein [a1 a2 a2 a3 ... a13 x1 x2] are the received n-state symbols. The value of the expression was already determined to be 0 if no errors have occurred. In fact the expression can be written as $a7=15a1+9a2+15a3+3a4+14a5+4a6+9a8+4a9+a11+3a12+7a13+14x1+7x2+0$. Keep in mind that '+' herein is 'add16' over GF(16), and thus subtracting is the same as adding. Furthermore, the difference between the already calculated expression or row 9 (which is 13) and the actual value (which is 0) is the error magnitude. That means that the actual value is the received value (0) added with the error magnitude (13), so the actual value is 13.

In formula: an expression with term $a7_{correct}$ should have as result 0. One may say that $a7_{error}=a7_{correct}+error\_mag$. One may write the expression without error as: $term1+a7_{correct}=0$, wherein term1 is without error, as an error only occurs in a7. With error one can write: $term1+a7_{correct}+error\_mag=val$, wherein val the value is of the evaluated expression. One may add the two expressions: $term1+term\ 1+a7_{correct}+a7_{correct}+error\_mag=val+0 \rightarrow error\_mag=val$. To determine the correct value of the symbol in error one has to correct the received value with 'val' using '+' which is 'add16' in GF(16). This makes the error correction process extremely fast.

In order to determine an error magnitude of a symbol in error in a simple manner, one should select a row in a comparative matrix which generates not 0 for at least one symbol in error and has the coefficient 1 for the symbol in error. The evaluated row in such a matrix provides directly the error magnitude, which should be added over GF(16) with the received symbol value to determine the correct value.

In a further example one may receive a codeword of 15 16-state symbols of which 13 symbols are data symbols. The received codeword is [13 4 5 8 0 1 12 15 6 14 14 1 5 3 5]. Entering the values of the 16-state symbols into the expressions defined by the comparative matrices, generates the two error vectors e1 and e2 as shown below.

| moment | expressions_matrix1 | expressions_matrix2 |
|---|---|---|
| initial-start | 6 | 14 |
| 1 | 2 | 12 |
| 2 | 15 | 0 |
| 3 | 0 | 15 |
| 4 | 3 | 5 |
| 5 | 8 | 12 |
| 6 | 15 | 15 |
| 7 | 3 | 10 |
| 8 | 13 | 14 |
| 9 | 2 | 11 |
| 10 | 14 | 5 |
| 11 | 8 | 11 |
| 12 | 14 | 10 |
| initial-end | 13 | 3 |

These vectors indicate that the fourth symbol is in error. The third row (row with label 2) has an expression in the first comparative matrix wherein the fourth symbol has coefficient 1. The error vector for that row has value 15, with is the error magnitude. Symbol 4 as received has value 8. The correct value is thus $symbol4=8+_{GF(16)} 15=2$.

Figure 7:
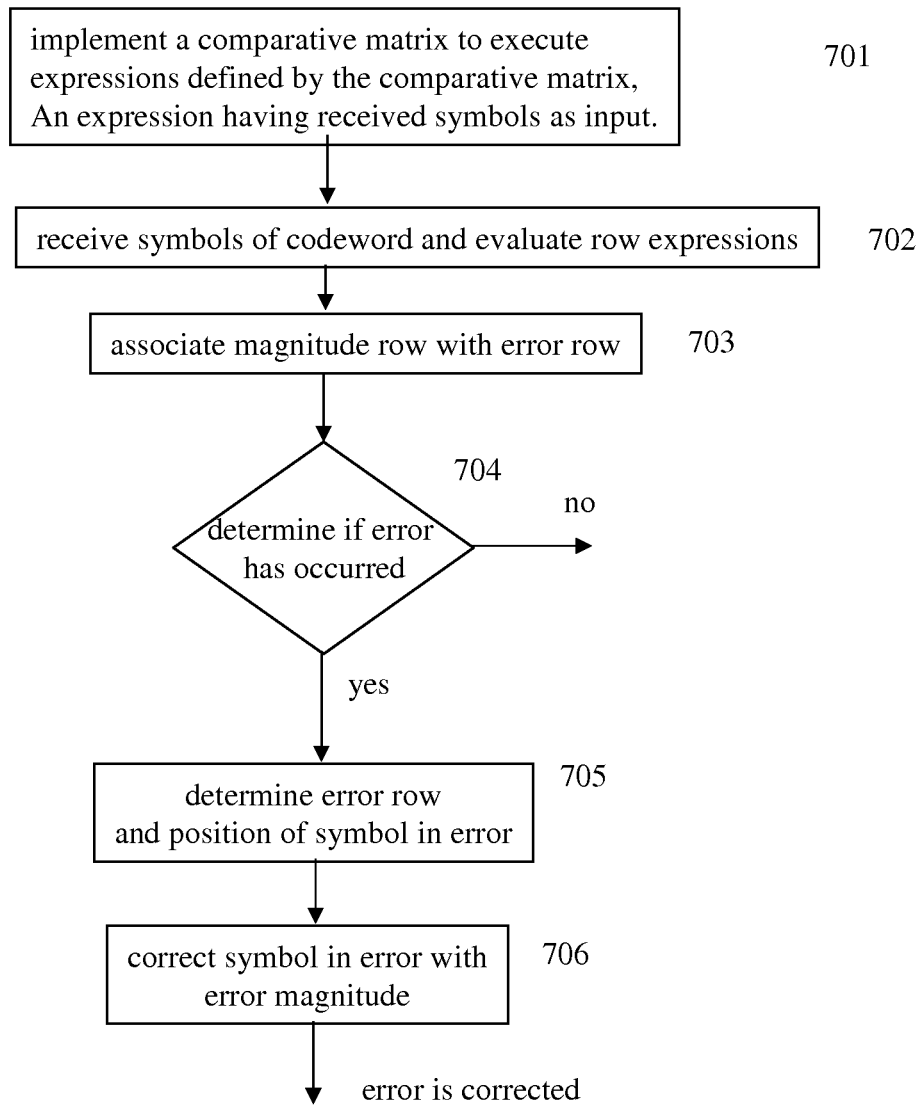
FIG. 7 is a flow diagram of an error correcting approach in accordance with an aspect of the present invention.

A flow diagram for locating and correcting errors in accordance with an aspect of the present invention is provided in FIG. 7. This flow also applies to error location of more than 1 error with more than 2 check symbols. This may require the use of additional error vectors and reviewing more than one row. However, the principle is the same.

FIG. 7 shows that in a first step 701 a comparative matrix, based on all forward and reverse intermediate states of an encoder is implemented. This means that each row of the matrix represents an expression and each expression can be evaluated after entering the symbol values after receiving in step 702.

In a step 703 a specific row in error is associated with a corresponding error magnitude row.

In a step 704 it is determined if an error has occurred. When all rows generate value 0, no error has occurred. If one error has occurred in the 2 check symbol case, at least one row will be not zero in the matrix.

In step 705 the row in error with the symbol in error and the error magnitude will be determined. And in step 706 the error will be corrected.

Figure 8:
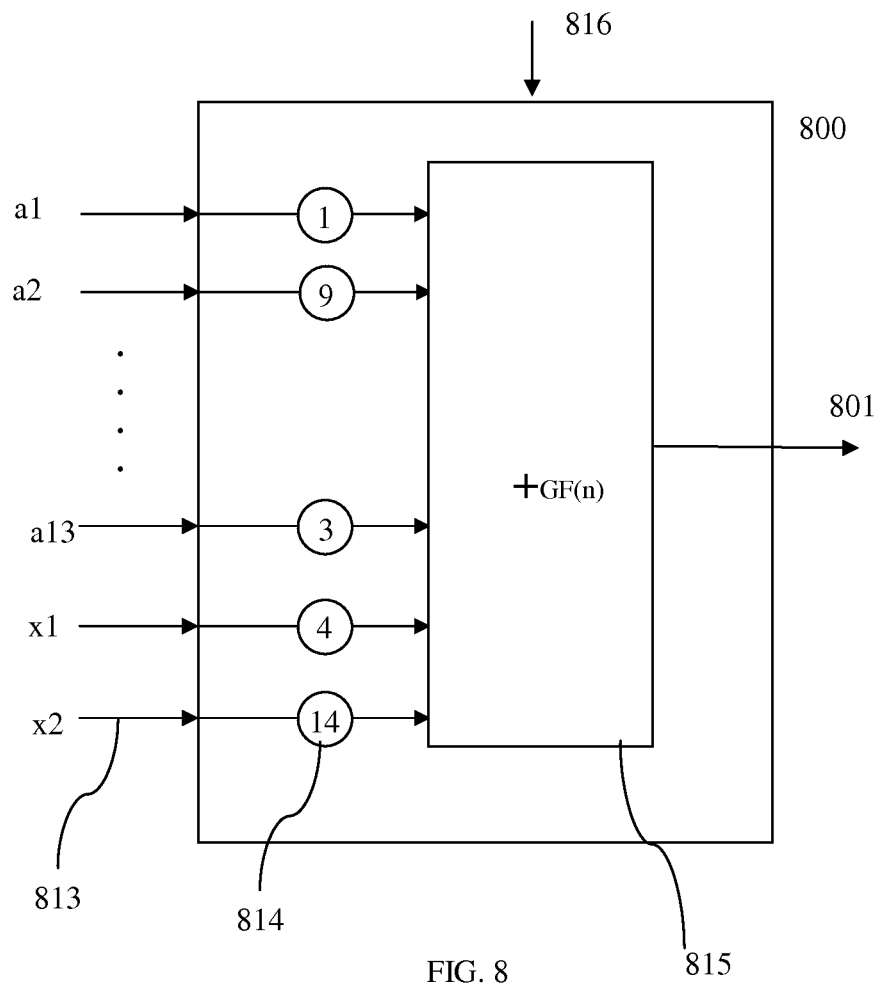
FIGS. 8-10 illustrate an implementation of an aspect of the present invention.

The error location and correction process such as provided in FIG. 7 in one embodiment is implemented on a processor, such as a digital signal processor. One may also speed up the error location and correction by implementing processes in parallel. In one implementation the GF(16) multiplication p3*a3 for instance may be implemented by having a GF(16) multiplication circuit. It has been shown by the inventor elsewhere, for instance in U.S. Pat. No. 7,562,106, issued on Jul. 14, 2009, which is incorporated herein by reference in its entirety, that a constant n-state multiplier can be represented by an n-state inverter. For instance the multiplier over GF(16) by a factor 13 can be implemented by the 16-state inverter [0 1 2 3 4 5 6 7 8 9 10 11 12 13 14 15]→[0 13 14 15 1 2 3 4 5 6 7 8 9 10 11 12]. FIG. 8 shows in diagram a circuit to evaluate an expression. For instance the $4^{th}$ row of the 2 check symbol first comparative matrix is a vector [1 9 4 0 1 3 7 7 14 15 9 15 3 4 14]. This represents the expressional*p1+a2*p2+ . . . a13*p13+x1*p14+x2*p15, wherein [a1 a2 . . . a13 x1 x2] is the received codeword with [x1 x2] the received check symbols. One can see that circuit 800 implements this expression. Signals representing [a1 . . . x2] are provided on inputs whereof input 813 for signal representing x2 is identified in FIG. 8. This signal is provided to inverter 814 which represents a GF(16) multiplier 14. The resulting signal is provided to an adder over GF(16) 815. The adder 815 in one embodiment is a repetitive adder which starts with 0 and adds to a GF(16) sum the consecutive terms, for instance under control of a clock signal. The adder 815 in another embodiment is a plurality of adders over GF(16), each adder adding 2 terms. For 15 terms one has to use 7 adders for 14 terms, providing 7 output values. Following these adders are 4 additional adders over GF(16) which reduce the 8 terms (one previous term and the 7 sums) into 4 outputs. A final comparative state is then achieved by reducing the number of terms 2 more times with additional adders over GF(16). The comparative state in such a multi-adder circuits requires about 4 adding cycles.

The result of the expression is provided on output 801. This result represents the $4^{th}$ digit in the first of two error vectors and will be named e1(4). A clock signal 816 may be provided to provide correct timing signals.

Figure 10:
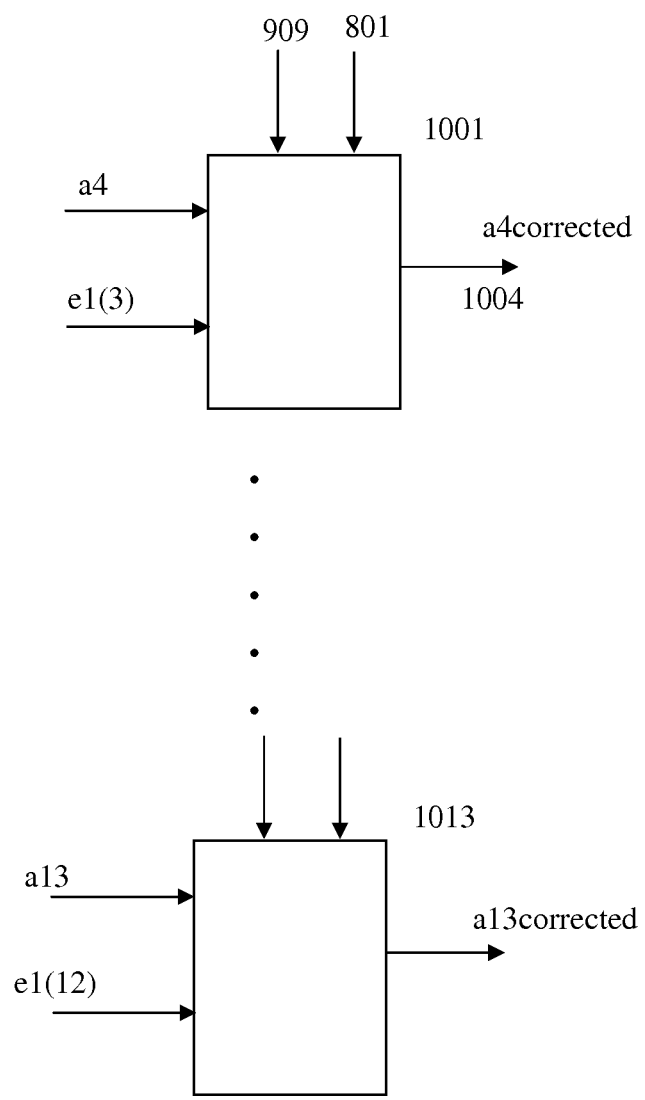

The circuit of FIG. 9 is a decision circuit 900 to determine if an error has occurred. The circuit receives at least result signals provided on inputs 801 and 813 of at least two error circuits. If at least one error signal is not 0 an error has occurred, the result thereof is provided on output 909. For instance, if signal on 909 is 0 no error has occurred. If the signal is not 0 an error has occurred. Other ways to determine if an error has occurred are possible. For instance, one can recalculate the check symbols. However, if one wants to avoid delay, one should apply circuits of which the results can be re-used. This aspect is demonstrated in FIG. 10. Herein 13 error correcting circuits are included of which 1001 and 1013 are identified. Circuit 1001 receives signals generated on 909 and 801. This indicated to 1001 if an error has occurred (by 909) and if the fourth symbol was in error (by 801). On additional inputs received signal a4 and error magnitude signal e1(3) are received. One is reminded of the fact that if the fourth data symbol is in error then the third digit in the first error vector provides the error magnitude. Circuit 1001 includes an adder over GF(16) which adds the error magnitude to the received symbol value. Accordingly, output 1004 generates the corrected symbol, if the symbol was in error. If the symbol was not in error (909 indicates an error and 801 was not 0) then the value of a4 is passed through without modification to the output. One can implement the above approach for each of the 13 data symbols in the codeword. Circuit 1013 performs that error correction process for the $13^{th}$ data symbol. Accordingly, the circuit of FIG. 10 generates the correct 13 symbols of the received codeword if only one symbol was in error. This circuit as shown does not correct check symbols in error. However, if so desired one can implement that aspect also.

The shown methods and apparatus thus provide very fast error location and correction.

One can detect more than 1 error by interleaving two codewords, in one embodiment, wherein in each codeword one error can be detected, located and corrected.

In many cases an n-state symbol is implemented in binary form in p bits. For obvious reasons, it can happen that errors occur in no more than p adjacent and consecutive bits and still putting two adjacent n-state symbols in error. It is beneficial to be able to error correct 2 or more adjacent n-state symbols in error.

One may wonder why the error correcting method is limited to 13 data symbols as dictated by the rules for RS codes. If one keeps 2 check symbols in a codeword but runs the coder for more than 13 data symbols it will turn out that the comparative matrices are cyclic and the rows will be repeated. This makes it impossible to determine with certainty which symbol is in error. If one is able to provide some measure of probability where an error has occurred one should be able to estimate a value for a corrected error.

Increasing Security

In many applications the ability of a system (such as a data storage system or a data transmission system) to detect, locate and correct n-state symbols in errors is critical to the standard operation of the system. For instance, on optical disks such as CD or DVD players a minimal amount of resistance to errors (for instance scratches or dust on the disk surface) is required to allow the system to operate. If no error correction would be available, even minor flaws would render the playback of the data by the system completely inoperable. Reed Solomon codes are often applied in these systems. Because of the systematic nature of the error correction methods, there is very little security in the operation of the error correction.

In accordance with a further aspect of the present invention significant security is provided in the error correction process by some simple modification of aspects provided above.

In one embodiment security is provided by starting with an initial state of the shift register of the encoder (or with an initial state of the encoding process) which is not all zero. This means that the end state of the encoder which provides the check symbols is modified by the effect of the initial state of the encoder, and so are the intermediate states of the encoder. This does not influence the zero result comparative equations as far as the position of the symbols, but it does affect the calculated non-zero results. To address non-zero initial values additional (virtual) initial symbol positions are added to the vector. These symbols strictly function as a correction, and no 'errors' in these initial values are detected. However, if one is not familiar with the initial values, it is very difficult to determine the error magnitude of an error. One may change the initial value per codeword. Clearly, a decoder needs to be programmed with the correct initial value.

Figure 11:
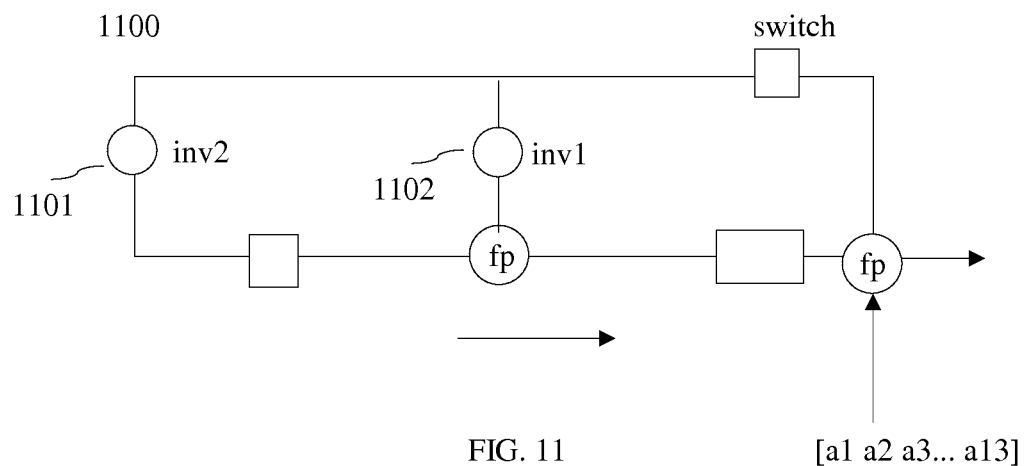
FIG. 11 is an example of an encoder in LFSR diagram in accordance with an aspect of the present invention.

In another embodiment one may apply at least one n-state inverter in an encoder which is not a multiplier over GF(n) but still leaves a state 0 unmodified. This is illustrated in FIG. 11 in encoder 1100. It looks like the encoder of FIG. 5. However, instead of only multipliers, n-state inverters 1101 and 1102, inv2 and inv1 respectively have been used. Assume that inv2 is a multiplier over GF(16) which can be expresses as [0 1 2 3 ... 15]→[0 a b c ... p]. Assume also that inv1 is inverter [0 1 2 3 ... 15]→[0 k q r ... m] which is not a multiplier over GF(16).

It should be clear that even though the inverters change the value of a vector [0 x1 0 0 0 x2 0 0 0] to for instance [0 y1 0 0 0 y2 0 0 0], the state 0 is left unchanged by the inverters. The state 0 is also left unchanged by the addition as $0+_{GF(16)} 0=0$. Accordingly, one can generate comparative state matrices that will have 0 value coefficients. One should preferably select n-state inverters that are distributive with $+_{GF(n)}$ to make expression evaluation in forward and reverse direction relatively simple.

In yet another embodiment, the code is shortened and at least one n-state symbol that is dropped from the code is non-zero. This affects the value of the check symbols. One can change the value of at least one dropped symbol in a shortened code per codeword.

For illustrative purposes the error location and correction has been shown for a 2 check symbol system for a 16-state code. One can easily expand the above approach for other values of n. The method and system works the best when the number of data symbols is greater than the number of check symbols. For instance the inventor has checked the approach for a 32-state code for a (31,29) code wherein 29 32-state symbols are applied to generate a 31 32-state codeword with 29 data symbols and 2 check symbols to correct at least one symbol in error. One should first generate the field GF(32) and determine the encoder equivalent to FIG. 11, wherein fp is the addition over GF(32) and inverter inv1 is a multiplication 4 over GF(32) and inverter inv2 is a multiplication 20 over GF(32). In the reverse direction the inverter inv1 is replaced by a multiplication 29 over GF(32). One can arrive at the inverters by first creating the generating polynomial $(X-a^1)*(X-a^2)$, which leads to $X^2+(a^1+a^2)*X+a^1*a^2$. By correctly naming the states in GF(32) this leads to $X^2+20*X+4$. The inverse of multiplication 4 in GF(32) is 29. The comparative matrices are generated in a similar way as in the 16-state case. This leads to 30 by 31 matrices wherein in at least one matrix wherein a row vector has only one position with coefficient 0, which is applied to find an error position.

The first row of the first of two comparative state matrices for this code is [0 1 18 25 21 31 4 12 27 19 16 15 24 15 9 25 8 2023 29 17 15 15 20 2 22 15 2 3 4 24]. The 29 32-state symbols [0 8 0 0 0 15 0 0 6 0 0 0 8 0 0 0 15 0 0 6 0 0 0 8 0 0 0 15 0] will generate the two check symbols [8 2], when the initial encoder state is [0 0]. One can easily check that the reverse coder with initial state [8 2] and applying the data symbols in reverse will generate initial state [0 0].

It turns out that one can use encoders that are not generated by a generator polynomial with consecutive powers of elements of GF(32) to create a workable set of comparative matrices. For instance, one can change multiplier 20 to multiplier 19 and still achieve a workable set of matrices. This modification outside the scope of traditional design of RS codes provides a further level of security as an aspect of the present invention.

It has been shown above that one can detect, locate and correct at least one error.

We will now return to the 16-state encoder that generates 4 check symbols.

The location of at least 2 consecutive or adjacent symbols in error is also possible with the approach as provided herein. It is a bit more involved than locating a single error, but not by much. The reason for the greater number of steps is that one or two errors could have occurred. Furthermore, two errors can cancel each other in at least one expression. One should select the result of expressions that unambiguously determine if no errors, one error or two errors have occurred. To explain the process several representative situations will be dealt with.

The easiest case is where no errors have occurred. In that case all expressions will generate result 0.

The next situation deals with the first two symbols in a codeword. The first symbol may be in error, the second symbol may be in error. Or the first and the second symbol may be in error.

One is referred to the above 4 comparative states matrices. For the situation wherein only the first symbol of the codeword is in error, the error values generated by the expressions of the first row of the 4 matrices is [0 0 0 x], wherein x is always non zero if only the first symbol is in error. One can easily check that the expression first row of the $4^{th}$ matrix if only symbol 1 is in error can never be 0.

The next situation is wherein only the second symbol is in error. For the situation wherein only the second symbol of the codeword is in error, the error values generated by the expressions of the first row of the 4 matrices is [0 0 x 0], wherein x is always non zero if only the second symbol is in error. Actually, there are other combinations of error vectors that indicate that only the second symbol is in error.

The next situation is wherein the first and the second symbol are in error. For the situation wherein both the first and the second symbol of the codeword are in error, the error values generated by the expressions of the first row of the 4 matrices is [0 0 x y], wherein x and y are always non zero if the first and the second symbol are in error. Actually, there are other combinations of error vectors that indicate that the first and the second symbols are in error.

One has to associate pre-determined expressions with located errors to determine error magnitudes. For instance in case of both the first and the second symbol are in error one can associate the expression of the first row of the $4^{th}$ comparative matrix with the error magnitude of the first symbol, and the first row of the $3^{rd}$ comparative matrix with the error magnitude of the second symbol.

For the situation wherein only the third symbol of the codeword is in error, the error values generated by the expressions of the first row of the 4 matrices is [0 x 0 0], wherein x is always non zero if only the third symbol is in error. Actually, there are other combinations of error vectors that indicate that only the second symbol is in error.

The next situation is wherein the second and the third symbol are in error. For the situation wherein both the first and the second symbol of the codeword are in error, the error values generated by the expressions of the first row of the 4 matrices is [0 x y 0], wherein x and y are always non zero if the second and the third symbol are in error. Actually, there are other combinations of error vectors that indicate that the first and the second symbols are in error.

One can step through the intermediate states in a similar way to determine additional single or adjacent errors. There is only one situation that will not generate a specific 0 result. That is the situation wherein the last of the data symbols and the first of the check symbols are in error. This situation is detected by exclusion. For instance, if the last and the second to last row in the third matrix generate a result not equal to zero and no other errors have been located, then the $11^{th}$ and $12^{th}$ symbol are in error. Only the $11^{th}$ symbol has to be error corrected, unless one desires to correct check symbols. One can associate the last row of the $4^{th}$ matrix with the error magnitude of the $11^{th}$ symbol (keeping in mind that this generates 14*the error magnitude, so one has to correct by multiplying with 3).

Most of the evaluations can be performed concurrently. The error location of up to two errors followed by error correction can thus be performed within a very limited number of clock cycles.

One can apply the above approach to encoders for $n \geq 16$ and for $(p-k) > 4$. The inventor has created a forward and reverse 16-state encoder for $n=16$ and 5 check symbols. The forward 16-state coder is defined by the generator polynomial $X^5+8*X^4+3*X^3+6*X^2+2*X+1$. The reverse encoder applies the same multipliers but is operated in reverse. The detection of 1 error, and of 2 and 3 errors which are adjacent is straightforward and similar to the above approach. Again, the identification of adjacent errors in data symbols and check symbols requires the exclusion of other errors before these transitional errors can be located.

One may also generate 3 check symbol codewords to locate and correct up to two adjacent errors. This can be achieved by using a coder associated for instance with generator polynomial $X^3+14*X^2+2*X+11$. This generates a (15,12) code with 3 check symbols. One can detect up to two consecutive or adjacent errors using the above comparative matrices of which this code will generate three. Unfortunately, the comparative matrix may consistently indicate that 2 different consecutive symbols are in error. One set is identified because their coefficients in a row are zero. Another because two consecutive errors will cancel each other. For instance, two errors of equal magnitude will cancel each other in an expression that has two consecutive equal coefficients. For instance $5*X_i+5*X_{i+1}$ will add up to be 0 in GF(16). Unfortunately, there is no pattern in the related comparative matrices that indicates which of the two found errors are the true errors. Fortunately, one can still find the true errors by solving each of the double errors and recalculating the error vectors with the error matrices. The 'wrong' set of solved errors will only generate some of the expressions defined by the rows to be zero. The 'correct' corrected errors will generate all zero error vectors for all rows. While it increases the number of calculations, it still allows the correct error location, and correction of up to k n-state symbols in error in a code of p n-state symbols of which $2*k-1$ symbols are check symbols.

In one embodiment n-state symbols are represented by binary signals. In another embodiment $n=16$. In another embodiment $n>16$.

It should be clear that the approach of recalculating error vectors in case of ambiguous error locations can be applied in each of the situations wherein a choice has to be made about which n-state symbols are really in error.

The herein provided aspects of error location and correction are attractive alternatives to traditional RS error correcting methods, especially in the case of single errors and of a limited number of adjacent errors.

For illustrative purposes, the methods and apparatus provided herein have been applied for truly unknown error locations. It should be clear that in case one suspects that an error has occurred in a certain part of a codeword, one can limit the number of expressions to be evaluated. In case of an erasure (one knows the error location, but not the error magnitude) one can evaluate the expression associated with a magnitude of a symbol in error as provided above, and evaluate the magnitude directly. For instance, in the code with 2 check symbols having a first and a second erasure, one can rapidly determine the magnitude of the first erasure, by selecting an expression that has not the symbol of the second erasure as a variable. One can apply the same approach for determining the magnitude of the second erasure by selecting an expression that has not the symbol related to the first erasure as a variable. The first and second erasure do not require to be adjacent to be resolved if no additional errors are included. One can thus always resolve q erasures with $q=t+1$, with t being the number of 0 coefficient variables and at least t erasures coinciding in position with 0 coefficient variables.

One may start the error location process by recalculating the check symbols, with received data symbols which only requires the evaluation of one expression. In case the generated check symbols are identical to the received check symbols, it may be assumed that no n-state symbols were in error.

It is again pointed out that the methods and apparatus for encoding and decoding are associated with an n-state LFSR. However, no real LFSRs have to be applied as each LFSR state including comparative states can be expressed and evaluated by individual expressions or n-state switching expressions implemented with n-state or binary devices. It should also be clear that each state and/or comparative state can be evaluated without first evaluating a preceding or succeeding state, which allows all states including comparative states to be determined concurrently. The methods and aspects of the present invention can be implemented in a processor. They can also be implemented in parallel processors that determine encoding states including intermediate states and comparative states concurrently. A processor may be a programmable processor with a memory to store and provide instructions that perform the steps of the present inventions. A processor may also be customized or hard wired circuitry that performs one or more instructions. Such circuitry can be Field Programmable Gates Arrays (FPGA) circuitry for instance. The aspects of the present invention may also be provided as a set of instructions that are part of a library, which can be selected by a user to program an FPGA circuit to create a processor that performs instructions to execute aspects of the present invention.

Tables, such as the ones representing coefficients of comparative coding states or of n-state truth tables such as defined over GF(8) in one embodiment of the present invention are stored in a RAM or a ROM device or in a flash memory, on a magnetic, optical or magnetic-optical device or on any other memory device that can store and retrieve n-state symbols, if required represented by p-state symbols such as binary symbols. Symbols and instructions can also be stored by hard-wired circuitry.

It has been shown that the above approach also works for $n > 16$.

It is believed that the apparatus and methods provided herein offers very fast location of single errors in relatively long sequences of data symbols with very little overhead in check symbols. It provides for certain types of errors an inexpensive and very fast alternative to for instance Reed Solomon codes.

In certain cases one may want to determine an error in a sequence with fewer n-state symbols than is maximally possible. In for instance RS-codes, these type of codewords are known as shortened codes. One may assume that a certain number of symbols is equal to the 0 symbol. This is known in the decoder and one does not have to send these 0s, which are automatically inserted for decoding. One may apply a similar approach as an aspect of the present invention. However, it is not required to assume that the 'missing' symbols are 0s. The 'missing' symbols may be assigned any valid n-state symbol state. Furthermore, it is not really required to use assumed data symbols that are not really transmitted. One may determine forward and reverse states and check symbols, based on actually transmitted symbols. The comparative state matrix then stops after the last transmitted n-state symbol. In one embodiment it is required that the number of transmitted data symbols is at least equal to the number of check symbols. In a further embodiment it is required that the number of transmitted data symbols is greater than the number of check symbols.

The n-state functions such as the adder and the multipliers over GF(n) can be implemented in different ways. In a first embodiment, a truth table of an n-state function is stored in an addressable memory. An input to such a memory is a signal representing an n-state symbol. An output of such a memory is a state of the truth table dependent on the input. Signals may be binary signals or non-binary signals. N-state truth tables may also be implemented by active switching circuits. For instance, adders and multipliers over GF($n^m$) with m>1 can be implemented with binary circuits, which is known in the art.

The encoding, reverse encoding, error location and error correction aspects that are provided herein can be applied in different kind of systems wherein symbols are transmitted and/or received and/or processed as signals. Many of these systems require processing of symbols at a speed that requires processors working at a clock rate of at least 1 kHz or at least 1 Mhz. This means that humans cannot reasonably perform the steps provided herein as one or more aspects of the present inventions and processing circuitry, which can be electronic or other type of processing circuitry, is required. An n-state symbol with n>2 can in one embodiment be represented by a plurality of signals, for instance binary signals. An n-state symbol in another embodiment can also be represented as an n-state signal. A processor thus herein is assumed to be comprised of binary or n-state switching circuitry to implement at least one binary or n-state switching function.

Figure 12:
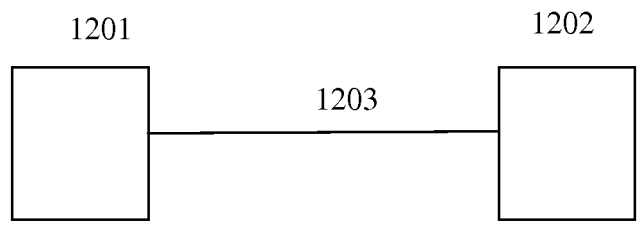
FIGS. 12 and 13 illustrate a system in accordance with an aspect of the present invention.
Figure 13:
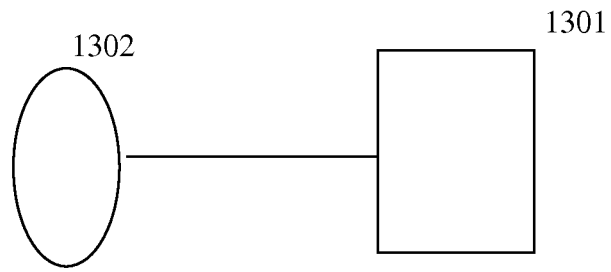

A system that applies aspects of the invention as provided herein is a communication system as shown in FIG. 12, including at least two devices that communicate of which a first device 1201 encodes and transmits n-state symbols over a channel 1203 and a second device 1202 receives and error corrects n-state symbols transmitted by the first device. Devices in such a communication system in one embodiment transmit over a wireless channel 1203. In a further embodiment the devices transmit at least over part of a transmission channel over a wired transmission channel 1203, which may be an optical fiber medium or a metallic medium. A system in another embodiment is a data storage system as shown in FIG. 13 wherein a device 1301 reads n-state symbols from a medium 1302. Such a medium in one embodiment is an electronic memory. In a further embodiment a storage medium 1302 is a magnetic medium. In yet a further embodiment a storage medium is an optical, an electro-optical, or a magneto-optical medium. In yet a further embodiment a storage medium is a medium that can store n-state symbols and is enabled to be read by a reader to read the n-state symbols from the medium. An n-state symbol can be represented by a plurality of binary symbols or by a single n-state symbol. A symbol on a medium is in one embodiment a modification of the medium at a certain location which can be called a mark. A mark can be a change in an electronic, magnetic, optical, chemical, quantum-mechanical, biological, or mechanical property or a combination thereof. A mark can also be represented by a logical state of a device, which may be reflected in a dynamical switching property such as exhibited by a memory latch. A mark can also be represented by a physical state of a material.

Comparative Coding States

A comparative coding state herein is used for an expression that uses at least a plurality of n-state symbols, including a check symbol and a data symbol, as variables. The expression that determines a comparative coding state will generate a pre-determined value when all the symbols in the expression that serve as a variable are without error. In general the pre-determined value is 0. However, one could have another constant value. The striking property herein is that the expression has a predetermined value without errors in the variable no matter what the values are. The easiest way to determine the comparative expressions which may be called comparative states, is to determine states of an LFSR related encoder in a forward and in a reverse coding direction. For causal reasons corresponding states either determined in forward direction or in reverse direction have to be identical when no errors have occurred. A comparative state may have a different value than the predetermined value if an error has occurred in a symbol that acts as a variable in an expression. For convenience it is desirable that at least one symbol of a plurality of symbols is not a variable in an expression, because that means that even if that symbol is in error it would not change the predetermined value of the expression if all other variables are error free.

It is thus possible in some instances (for instance in shortened codes) to create equations that may not correspond to actual physical forward or reverse coding states of an LFSR. However, such a comparative state still defines a comparative state of an encoder or of a code to which the symbols in a codeword that is analyzed have to conform. Ultimately, all comparative states depend upon the structure of the coder, even if the encoder does not physically realize a related forward or reverse state. A comparative state herein thus means a state defined by an expression determined from a coder that may be operated in forward and in reverse direction, which assumes a constant predefined value which may be 0, that is independent of the values of symbols if all the symbols that are expressed in the expression are error free.

In one embodiment of the present invention a Linear Feedback Shift Register (LFSR) is any device that can generate the shift register states associated with the LFSR, wherein the LFSR is an n-state LFSR with n=2, or n>2, or n>3, or n>7 or n>8 or any other value or state of n for which an LFSR can be realized. If one can determine a state of a shift register of an n-state LFSR one can determines states in a forward or a reversing direction of the LFSR. For instance, one can implement an n-state LFSR in binary logic in a processor with a CPU and a memory.

An expression that determines a comparative state from a forward and a reverse state of the LFSR is developed with intermediate results as signals representing n-state symbols are being received by a decoder. For instance, in the earlier above example a 15 symbol n-state (15,13) codeword is being received by a decoder. A comparative coding state is determined by a 16-state expression: m1*a1+m2*a2+m3*a3+m4*a4+m5*a5+m6*a6+m7*a7+m8*a8+m9*a9+m10*a10+m11*a11+m12*a12+m13*a13+m14*s1+m15*s2, wherein m is a constant multiplication, symbols 'a' are data symbols and symbols 's' are check symbols, and '*' and '+' are multiplication and addition over GF(n), where n=16 in the example. A multiplication as applied herein is in fact an inversion of an n-state symbol with an n-state inverter.

Figure 14:
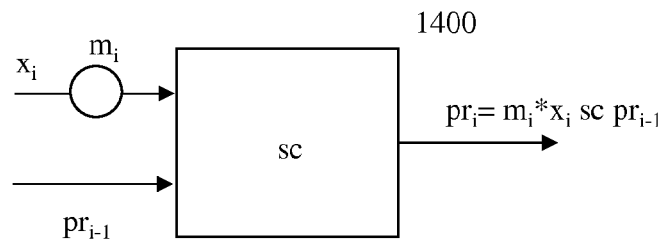
FIGS. 14 and 15 illustrate an implementation of an n-state switching function in accordance with an aspect of the present invention.

In one embodiment of the present invention the above expression is evaluated as signals representing n-state symbols are received by a decoder. This means that a partial result is evaluated as a combination of a previous partial result and an incoming n-state symbol modified by an n-state inverter. This can be expressed as: $pr_i = pr_{i-1}$ sc $m_i^* x_i$, wherein $pr_i$ is the partial result after symbol x, has been processed, $pr_{i-1}$ is the partial result after symbol $x_{i-1}$ has been processed and ($m_i^* x_i$)

can be symbol $x_i$ inverted by n-state inverter $m_i$, and sc is a function in GF(n) for instance an addition. This evaluation of an expression in a moving manner is illustrated in FIG. 14 1401. It is to be understood that functions sc and inverter $m_i$ in one embodiment can be stored in a memory and retrieved for execution at every next symbol and wherein $(m_i*x_i)$ and $pr_{i-1}$ are inputs to an addressable memory and $x_i$ is an input to a memory containing an inverter.

For instance in a Matlab® instruction the truth table of an addition over GF(16) can be stored in a matrix 'sc' and $m_i$ can be stored as a vector 'inv'. Suppose that an input symbol $A=x_i$ is provided on the input of 'inv' which results in an output $C=inv(A)$. For instance the multiplier is 16-state inverter inv=[0 5 6 7 8 9 10 11 12 13 14 15 1 2 3 4]. The input A=7 will generate output A=inv(7)=11 (with origin 0). The function 'sc' is a matrix storing the truth table of addition GF(16). Assume that the previous stage generated a partial result P=8. The instruction $pr_i=pr_{i-1}$ sc $m_i*x_i$ will be executed as PR=sc (P,A)=sc(8, inv(7))=sc(8, 11)=9 (with origin 0). It should be clear that both 'sc' and 'inv' are addressable memories.

The above "moving evaluation" of an expression can be implemented in a processor with memory to store the required n-state functions and inverters. It also to be understood that an n-state inverter may be a column or row in a stored multiplication table.

Figure 15:
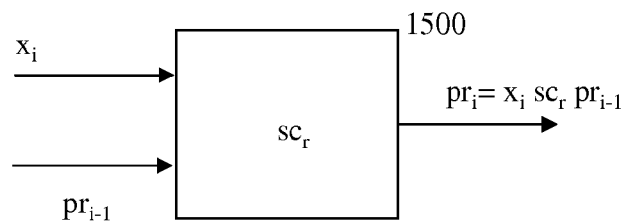

In another embodiment of the present invention the function sc can be modified or reduced into a single truth table representing an n-state function $sc_i$ as illustrated in 1500 in FIG. 15. This reduction of a 2-input n-state function in accordance with an n-state inverter has been explained in U.S. Non-Provisional patent application Ser. No. 10/935,960, filed on Sep. 8, 2004, now U.S. Pat. No. 7,643,632 issued on Jan. 5, 2010, which are both incorporated herein by reference. This reduction means that only the single expression $pr_i=(x_i$ $sc_i$ $pr_{i-1})$ has to be evaluated, as the inverter is reduced into the truth table of '$sc_i$'. This means that the expression is a single use of a memory with two inputs. In general, symbols are represented by 7 or 8 bits. That means that an 8-bit word represents a 256-state symbol. A reduced 2-input 256-state switching function contains $2^8*2^8$ bytes=64 kB or less than a Mbit of memory. For a (15,13) code one can optimize the coder by having a processor for evaluating each comparative state, wherein each processor requires about 14 Mbit in memory. While memory is not free, present day prices make the cost for a decoder using preferably memory based n-state functions very affordable.

An error locating method using comparative states allows the decoder to determine intermediate or partial decoding states as the decoder is receiving n-state symbols. This herein provided real-time processing or close to real-time processing of symbols or substantially real-time processing of symbols in decoding is different from the known method of for instance Reed-Solomon (RS) decoding. In classical RS-decoding a syndrome has to be determined based on a received codeword with check symbols and re-calculated check symbols. This means that all symbols have to be received before syndromes can be calculated. It has been shown herein, how check symbols depend upon the individual data symbols.

As one aspect of the present invention the check symbols of the received data symbols are determined as symbols are being received by also determining partial results for the recalculated check symbols. In one embodiment an n-state symbol in a codeword is received and is being processed by a processor to determine a partial result of an expression that determines a comparative coding state before a next codeword in the codeword is available for processing a partial result by the processor. In a further embodiment of the present invention an n-state symbol in a codeword is received and is being processed by a processor to determine a partial result of an expression that determines a comparative coding state before the final n-state symbol in the codeword is available to determine a partial result by the processor.

In one embodiment of the present invention intermediate values or states of the check symbols or expressions that evaluate those states or symbols from the received symbols are evaluated as symbols come in. In one embodiment of the present invention an intermediate state or value of an expression is determined after a symbol is received and before the next symbol is received. In a further embodiment of the present invention an intermediate state or value of an expression is determined after at least two consecutive symbols are received, but before all symbols in a codeword are received. It should be clear that this aspect of the invention can also be applied to calculating the value of check symbols in the classical RS decoding method. It is believed to be novel that an intermediate state or a final state of a comparative state is determined.

In a further embodiment of the present invention a processor or a logic device determines not only an intermediate state of an expression that determines a comparative state of a decoder, but also determines an intermediate state of a corrected value or state of a symbol. In such an embodiment expressions that determine a correct state or value of a symbol in error are executed to generate intermediate states as symbols come in despite it not yet being known or determined yet which (if any) symbol is in error. Based on the final determination of the comparative states it is determined which symbol or symbols were in error and the calculated corrected value(s) or state(s) are selected from all calculated values or states. This may require an overhead on processing capabilities. However, it also means that errors will be corrected right after or close to after the last symbol in a codeword has been received. This is useful, for instance in situations wherein the clock speed of a processor is in the same range as the symbol speed of the received signal and symbols are required to be processed in real-time.

The calculation of a check symbol in for instance an RS code with an LFSR is known. An intermediate state of the check symbol is a state of the corresponding shift register element of the LFSR. The generated check symbols classically are determined as a result of a polynomial arithmetic. In the LFSR an intermediate state of a shift register element is determined by first adding (generally over GF(n)) an n-state symbol with a symbol in a last shift register element of the LFSR, and then feeding back that generated symbol, possibly via a multiplier into another addition.

As an aspect of the present invention a check symbol is being determined as a linear expression in GF(n). Such an expression has the form: $s_k=m_1*a_1+m_2*a_2 \ldots +m_i*a_i$, which lends itself very well to be evaluated in intermediate steps as symbols $a_1, a_2, \ldots, a_i$ are being received, which is another aspect of the present invention. An intermediate state of a check is thus determined by fewer steps than in the LFSR.

Methods and steps provided herein, thus perform steps that are usually performed after all symbols have been received as intermediate steps that are performed after a symbol is received. Accordingly, the number of processor intensive steps after all symbols have been received can be reduced significantly as opposed to the prior art approach situation wherein all or most steps are performed after all symbols have been received. The prior standard approach requires a syndrome which necessarily can only be determined after all symbols have been received and processed.

Figure 16:
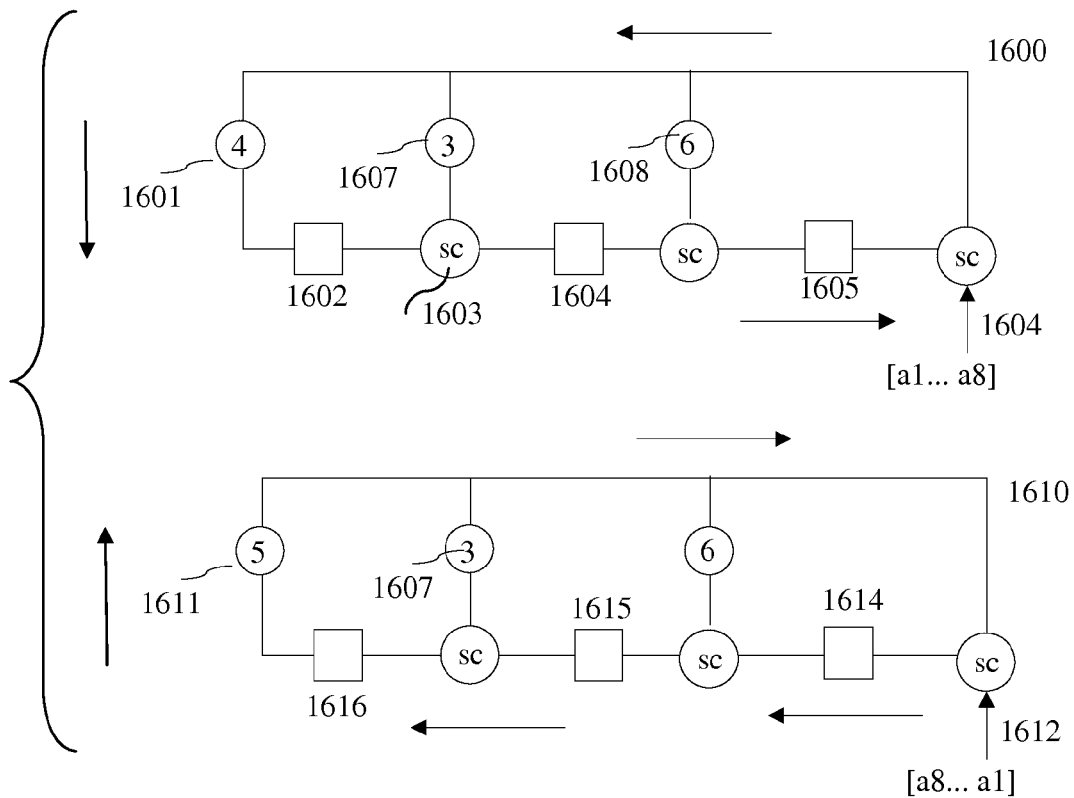
FIG. 16 illustrates a forward coder and a corresponding reversing coder in accordance with an aspect of the present invention.

One further example is provided using an 8-state LFSR coder as shown in FIG. 16. The coder 1600 is in forward or up direction and 1610 is in down or reverse direction. The functions "sc" as shown in circles such as 1603 are implementations of additions over GF(8); the circles such as 1601, 1607, 1608 and 1611 are implementations of multipliers over GF(8). For instance multiplier 1601 is a multiplier "4". One can easily check that its reverse as shown in 1611 is multiplication "5". It is noted that the multipliers can be any reversible n-state inverter and "sc" can be any reversible n-state function. For the method to be easily implemented it is preferred that the functions "sc" and n-state inverters are additions over GF(n) and multiplications over GF(n) because the finite field properties make all operations associative and distributive. The preferred finite fields include alternate finite fields as defined in US Patent Pub. Ser. No. 20110064214 published on Mar. 7, 2011 which incorporated herein by reference. Other functions can be used. However, this in general requires careful use of order of evaluation of terms.

The coder has a shift register of 3 elements of which 1602, 1604 and 1605 are shown in forward direction and are able to store (in this case) an 8-state symbol or any representation of such a signal, for instance a binary representation. In reverse direction coder 1610 the inputs and outputs of the storage elements are reversed and are elements 1614, 1615 and 1616. In coder 1600 on input 1604 8 8-state symbols [a1 ... a8] are entered and after completion of entering result in the check symbols [c1 c2 c3] being the content of 1602, 1604 and 1605. The initial content of the shift register may be all zeros, [0 0 0]. However, one may use any initial coding state of the shift register, which is different from prior standard practices.

In the reverse direction as shown in 1610 the content of 1614, 1615 and 1616 is the received set of check symbols [c1 c2 c3]. The received symbols are entered in reverse order. When no errors have occurred, the reverse coding will create the initial state of the shift register after completion.

It is assumed for this example that the initial state of the shift register is [0 0 0]. The input sequence is all ones or [1 1 1 1 1 1 1 1].

FIG. 17 show the three tables 1701, 1702 and 1703 with the comparative states determined before and after a symbol is entered. There are 9 states (including the initial state). Each state is determined by [c1 c2 c3 a1 a2 a3 a4 a5 a6 a7 a8] wherein [c1 c2 c3] are the received check symbols. One may expand the states with [i1 i2 i3] being the initial state of the shift register, if such a state is not zero. Because of the associative and distributive properties of the field, the terms in the tables are actually multiplication factors with which [c1 c2 c3 a1 a2 a3 a4 a5 a6 a7 a8] should be multiplied or inverted.

As an example one may take the first row of table 1701: [5 4 2 0 0 1 7 4 0 3 4]. One should read this as $5*c1+4*c2+2*c3+0*a1+0*a2+1*a3+7*a4+4*a5+0*a6+3*a7+4*a8$. If no error has occurred, the forward state is identical to the reverse state at a certain time and the expressions such as the above expression should be 0. One can easily see that a partial sum can be evaluated for each comparative state after a symbol has been received. The correct check symbols in this case are [2 7 3]. This means that the expression has value: $5*2+4*7+2*3+0+0+1+7+4+0+3+4=6+3+4+1+7+4+3+4=0$, which was to be expected. One can also see that a1, a2 and a6 do not contribute to the sum (as these symbols are multiplied by 0). Accordingly, if the sum is 0, but other sums are not zero wherein a1, a2 and a6 are not multiplied by 0, then one of these symbols is in error, as explained above. One should keep in mind that * is multiplication over GF(8) and + is addition over GF(8).

In accordance with an aspect of the present invention rows of the tables can be multiplied and added with each other to determine the '0' error state for one or more potential symbol in error. One may also add in this manner rows from different tables related to this coder, as each comparative state should be zero, or a neutral zero-value if one operates in an alternate finite field. For instance, one can derive almost directly the location of most two consecutive errors as can be seen in tables 1701, 1702 and 1703. However, there is no direct expression for the case wherein the check symbol c3 and the first data-symbol a1 are both in error. By adding the first row of 1701 with the first row of 1702 over GF(8) one will get [5 4 2 0 0 1 7 4 0 3 4]+[0 2 2 0 1 0 3 3 3 1 5]=[5 1 0 0 1 1 1 6 3 7 7]. This expression of a comparative state represents $5*c1+1*c2+0*c3+0*a1+1*a2+1*a3+1*a4+6*a5+3*a6+7*a7+7*a8$. This expression will generate a 0 when only c3 and a1 are in error.

It is possible to determine all possible error combinations that will generate a zero (or zero-neutral value) in certain expressions when certain errors occur and non-zero values in other expressions for the same errors. Such an error table is provided in FIG. 18 for the coder of FIG. 16. It shows the error expression table for errors always in a8 and in either: a7, a6, a5, a4 a3, a2, a1, c3, c2 and c1. It shows that errors in a3 and a4 are indistinguishable. This is not a problem as one may just assume that a3, a4 and a11 are in error and solve for these errors.

This means that all combinations of 2 errors can be covered by fewer than 50 expressions. It is pointed out that this number is independent of the value or state of the codeword symbols. It is thus much more efficient than a method wherein all possible codewords have to be generated. It is also pointed out that the herein provided method in accordance with an aspect of the present invention is extremely efficient for determining adjacent errors, as the required number of comparative state expressions is very low, and in the case of 2 or more consecutive n-state symbols in error for an n-state symbol codeword with 8 n-state symbols is at most 11.

At least two methods to calculate correct states for symbols in error after the errors have been detected are provided in accordance with one or more aspects of the present invention. The methods are related but can differ significantly in speed of execution. The solving methods both use the expressions of a comparative state but do so in different ways. The following table shows row 3 from table 1701 in FIG. 17 with the first row showing the related symbol names in a codeword.

| c1 | c2 | c3 | a1 | a2 | a3 | a4 | a5 | a6 | a7 | a8 |
|----|----|----|----|----|----|----|----|----|----|----|
| 2  | 4  | 3  | 2  | 4  | 0  | 0  | 1  | 7  | 4  | 0  |

Assume that it was determined that symbols a4 and a5 were in error, for instance, because the expression of row 4 was 0 and other rows were not. The above row in the table represents the expression $2*c1+4*c2+3*c3+2*a1+4*a2+1*a5+7*a6+4*a7=0$ or $2*c1+4*c2+3*c3+2*a1+4*a2+1*(a5+e5)+7*a6+4*a7=r1$. One is reminded that the expression without errors is always 0. The factor r1 is calculated during execution of the expression, for instance as symbols are being received and new terms of added to a partial result or sum as symbols are being processed. It was already decided that only a5 has an error term. The symbol a4 also, but this symbol has no influence on the expression as it is being multiplied by 0. In one embodiment, especially if r1 has already been determined. One can reduce $2*c1+4*c2+3*c3+2*a1+4*a2+1*(a5+e5)+7*a6+4*a7=r1$ to $0+1*e5=r1$ and determine directly that $e5=r1$ and the correct value of a received symbol a5r is a5=a5r+e5. In another embodiment one can determine the correct state of a5 from the expression a5=2*c1+4*c2+3*c3+ 2*a1+4*a2+7*a6+4*a7.

The above is illustrated with the following example. Assume that a data word is [1 1 1 1 1 1 1 1] which will be extended to a codeword with check symbols [2 7 3]. Assume that the codeword [2 7 3 1 1 1 7 6 1 1 1] was received. Evaluating the expression with the received symbols results into r1=5. This means that the error value is 5 and the correct value or state of a5 is 6+5=1, which is of course the correct state. It may occur that the multiplication of the error value is not 1. For instance m1*e5=r1. This then leads to e5=m1$^{-1}$*r1, which is still a very short expression as r1 is already determined.

One may also evaluate a5=2*c1+4*c2+3*c3+2*a1+4*a2+ 7*a6+4*a7 with the received correct symbol, which will generate also a5=1. If a5 in the expression has a coefficient not equal to 1, the final result has to be corrected with this coefficient's inverse.

It is clear from the above that solving an error, once the error location has been determined can be done very rapidly, in as little as one step or basic instruction after all symbols have been received and the error location has been determined. The extraordinary speed of determining and solving errors is enabled by the evaluation of partial results of a plurality of expressions as symbols are received. This means that the results are already almost completely evaluated when the last symbol in a codeword is being received. The completion of evaluating the expressions almost instantly allows determination of an error location as no roots of error location polynomials as applied in known methods have to be determined. Also, the error value or error magnitude is almost completely determined by the evaluated expressions and only a simple selection and addition is required, sometimes with a simple inversion.

The use of stored truth tables in memory of specific operations such as addition and multiplication over GF(n) and reduced truth table of an addition of two terms of which at least one is inverted assists in speeding up the operations.

It is important to create a coder/decoder with the appropriate inverters, especially if longer sequences of symbols are used. If not the appropriate inverters are selected, the comparative states will repeat themselves and error detection is limited to the non-repeating states. For illustration, the coder/decoder of FIG. 16 is used wherein inverter or multiplier '3' (1607 in 1600 and 1610) is replaced by multiplier "7". By using an all "1" input of [a1 . . . a8] the correct check symbols are [1 1 0]. The three tables showing the comparative states 1901, 1902 and 1903 are shown in FIG. 19. One can see that the comparative coding states of the first and second row of the tables are repeated at rows 8 and 9.

It is further noted, that in classical RS-decoding methods generally the roots of an error location polynomial are solved based on the calculated syndromes, followed by correcting errors after errors have been located. All the steps of error location and error solving are generally started after syndromes have been determined. These are relatively arithmetic intensive steps, that all have to be performed in quite a short time. In some cases the clock speed of the processor is at least one or two orders of magnitude higher than the symbol speed. In that case one may have sufficient time to solve errors. For instance, in situations wherein processor clock speed and symbol speed are in relatively similar ranges, or if codewords are very long, it may not be possible to solve errors in real-time with classical methods. At least in those cases, but also in other cases, the presently provided methods have a clear advantage over previous methods. It should be clear that systems and methods provided herein do in certain embodiments not require the determination of a syndrome.

In one embodiment of the present invention each error location or set of error locations is associated with an expression or set of expressions that will determine a correct value of the symbol(s) in error. If time is of the essence, the processor can evaluate all expressions into a partial result that correct a symbol in error as soon as a symbol is being received. This adds to processing overhead as correct symbol states are being evaluated for symbols that are not in error. The benefit is that as soon as the last symbol in a codeword is received, the error location can be determined from the finalized comparative states and the associated corrected symbol states have also been evaluated and can be provided on an output after being selected based on the error location result. This means that both error location and error correction take place in real-time, in one embodiment of the present invention before a symbol of a next codeword is being processed.

Such rapid solving is facilitated by assigning processors, which in one embodiment of the present invention are dedicated to a single task, either evaluation partial and final results of a comparative expression or to solving partial and final result of a correct state of a received symbol.

In one embodiment of the present invention, an n-state function can be implemented with classical binary circuitry, including devices that implement XOR functions.

Figure 20:
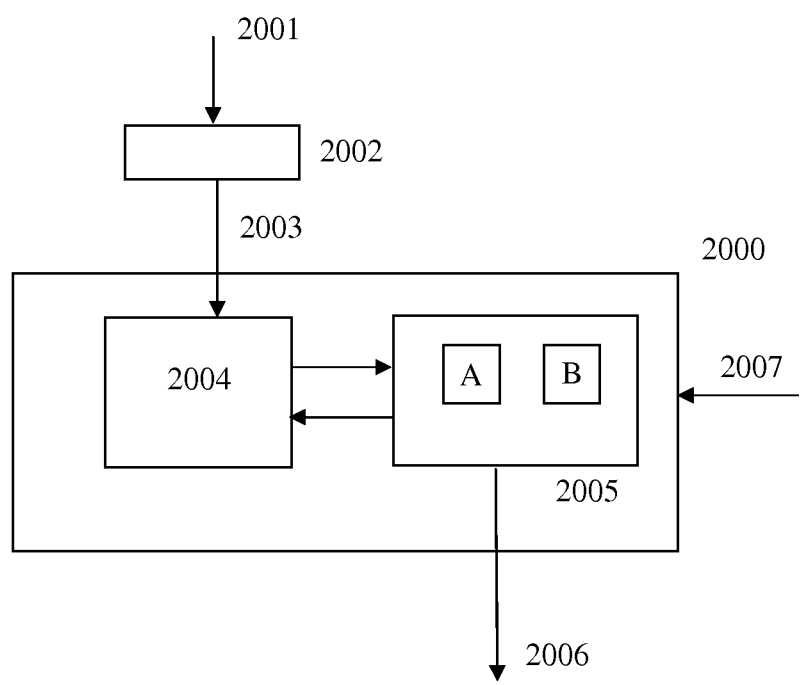
FIG. 20 illustrates a system in accordance with an aspect of the present invention.

The methods provided herein are implemented in one embodiment of the present invention on a system containing a general processor which performs instructions that perform the steps of the methods. Such a system also contains a memory that can store instructions and data that can be retrieved by the processor. One embodiment of a system 2000 is illustrated in FIG. 20. It contains a receiver 2002 that receives one or more signals through which the symbols are transmitted on an input 2001 and provides on input 2003 to the processor the symbols that can be processed by the processor. There are different methods and apparatus known to transmit and to receive the codewords as described herein. These can be baseband signals. They can also be modulated signals, included for instance Quadratic Amplitude Modulated (QAM) signals, or any other modulated signals known in the art to wirelessly transmit data signals, for instance in cell-phone communication.

The symbols may be temporarily stored on a memory 2004 for processing by processing unit 2005 which may be an ALU (arithmetic and logic unit). Such a processing unit may contain two or more sub-processing units or cores that can work in parallel, indicated by symbols A and B. The memory 2004 may be a distributed memory, for instance having dedicated local memories for data storage, instruction storage and intermediate results storage. The arrows inside 2000 indicate internal connections that allow the processing cores to access or provide data as required. At least one housekeeping signal provided to the system 2000, which may include a power signal and a clock signal, is provided an one or more inputs represented by input 2007. An output 2006 provides at least the correct data symbols.

While the symbols are n-state, they may be represented by p-state signals with p<n and the circuitry may be p-ary circuitry.

In one embodiment of the present invention the system is a communication system, such as a wireless communication system. For instance 2000 in an embodiment of the present invention is part of mobile and wireless receiving computing device. In a further embodiment the receiving computing device is a mobile phone, a cell-phone, a smart-phone, a PDS, an iPAD®, a tablet, an eReader or any other digital device that can receive error correcting coded signals. In an embodiment of the present invention 2000 is part of a data storage system. The system 2000 in an embodiment of the present invention is connected to a wireless network. In an embodiment of the present invention system 2000 is connected to the Internet. In an embodiment of the present invention system 2000 receives a satellite signal. In an embodiment of the present invention system 2000 receives signals representing an audio signal. In an embodiment of the present invention system 2000 receives signals representing a video signal. In an embodiment of the present invention system 2000 receives signals representing a data signal. In an embodiment of the present invention system 2000 receives signals representing a geo-positional or GPS signal. In an embodiment of the present invention system 2000 is part of a smart mobile phone. In an embodiment of the present invention system 2000 is part of a video display system. In an embodiment of the present invention system 2000 is implemented on a mobile phone. In an embodiment of the present invention system 2000 is implemented on a signal processor. In an embodiment of the present invention system 2000 is implemented on a custom designed circuit. In an embodiment of the present invention system 2000 is at least partly implemented on a customizable circuit.

For illustrative purposes FIGS. 21A, 21B, 21C and 22 illustrate a listing of Matlab code that performs certain steps as described herein in accordance with one or more aspects of the present invention. FIGS. 21A, B and C illustrate a listing of a Matlab program called 'ps8' captured in an m.file called ps8. This Matlab program operates in origin 1 for vector and matrices, and a constant 1 is added to truth tables and symbol states. The length of the program requires a listing in 3 parts, in FIGS. 21A, 21B and 21C but is executed on a processor as a single program. The program refers to two functions 'sc8t' and 'm8t' which perform operations sc8 and m8 over GF(8) in a vector. It is assumed that one understands how such a program works and it is not listed herein.

The program creates the table 'resrs' which represents the multiplication coefficients with which the individual symbols have to be multiplied in order to determine a comparative state. Accordingly a row in a table represents (rows are separated by a '9' for clarity) an expression for a comparative state of a shift register element. When a symbol of a codeword is received, the related coefficient in one embodiment of the present invention is retrieved from a memory or table and is multiplied with the state of the symbol. It is pointed out that with multiplication is intended an operation in accordance with the truth table of that operation and the result is added (or processed in accordance with the truth table of such an operation) with a previous partial result. In accordance with an aspect of the present invention, a comparative state and preferably a series of comparative states is developed as codeword symbols are being received.

A program that finds errors in a codeword is illustrated by its script listing in Matlab in FIG. 22. First a set of correct check symbols (captured as 'shifts') are generated and concatenated to the data symbols to create a codeword. For demonstration purposes an error vector 'er' is combined with the codeword to create a codeword with errors. A vector 'b1' is created, which by being all "0" indicates no errors, or by having some elements zero and others non-zero indicates that errors have occurred. The structure of zeros in the vector 'b1' or in a combination of these vectors for more shift registers, completely determines the error location in the word. Such error location vectors in one embodiment are stored in a memory and fully determine the error locations. This means that in one embodiment of the present invention almost directly after all the symbols have been received, if partial results are determined after each symbol is received, the error location vector points to the correct location of the errors. Each determined error location is associated with an expression that determines a correct value of the symbol in error. As before, an expression herein may be represented by its coefficients of multiplication (which are for instance stored in a memory) of the variables, wherein the variables are the symbols that are determined not to be in error.

As described herein, two methods provided as an aspect of the present invention can be used to solve the correct value. In the first method the symbol in error is solved by evaluating an expression anew that applies the variables not to be in error. In a second method the comparative states represent an expression for the error values related to the symbols in error. Because these states have already been evaluated it is easier to apply these results to determine the error value or error magnitude and add the result to the state of the symbol in error to determine the correct state. No syndromes are used to determine the error location or the correct value of the symbol in error.

The method as provided herein is extremely advantageous to determine (k−1) symbols in error in a codeword with k check symbols.

It is believed that the methods provided herein as an aspect of the present invention are faster than using syndrome calculations. It is contemplated that some aspects can also be advantageously applied to syndrome based calculations. Syndromes can be evaluated by creating partial results as symbols of a codeword are being received. In accordance with a further aspect of the present invention, roots of an error location polynomial, for instance as provided in Sklar's article "Bernard Sklar-Reed-Solomon Codes" which is available on-line at <URLhttp://ptgmedia.pearsoncmg.com/images/art_sklar7_reed-solomon/elementLinks/art_sklar7_reed-solomon.pdf> may be evaluated partially as symbols are being received. The partial results are stored and used when a new symbol comes in. This is substantially more complicated than other methods provided herein, but still can significantly speed-up the decoding process. It is noted that the syndrome methods cannot achieve the (k−1) performance as described earlier.

The following patent applications, including the specifications, claims and drawings, are hereby incorporated by reference herein, as if they were fully set forth herein: (1) U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS; (2) U.S. Non-Provisional patent application Ser. No. 10/936,181, filed Sep. 8, 2004, entitled TERNARY AND HIGHER MULTI-VALUE SCRAMBLERS/DESCRAMBLERS; (3) U.S. Non-Provisional patent application Ser. No. 10/912,954, filed Aug. 6, 2004, entitled TERNARY AND HIGHER MULTI-VALUE SCRAMBLERS/DESCRAMBLERS; (4) U.S. Non-Provisional patent application Ser. No. 11/042,645, filed Jan. 25, 2005, entitled MULTI-VALUED SCRAMBLING AND DESCRAMBLING OF DIGITAL DATA ON OPTICAL DISKS AND OTHER STORAGE MEDIA; (5) U.S. Non-Provisional patent application Ser. No. 11/000,218, filed Nov. 30, 2004, entitled SINGLE AND COMPOSITE BINARY AND MULTI-VALUED LOGIC FUNCTIONS FROM GATES AND INVERTERS; (6) U.S. Non-Provisional patent application Ser. No. 11/065,836 filed Feb. 25, 2005, entitled GENERATION AND DETECTION OF NON-BINARY DIGITAL SEQUENCES; (7) U.S. Non-Provisional patent application Ser. No. 11/139,835 filed May 27, 2005, entitled Multi-Valued Digital Information Retaining Elements and Memory Devices; (8) U.S. Non-Provisional patent application Ser. No. 12/137,945 filed on Jun. 12, 2008, entitled Methods and Systems for Processing of n-State Symbols with XOR and EQUALITY Binary Functions; (9) U.S. Non-Provisional patent application Ser. No. 11/679,316, filed on Feb. 27, 2007, entitled METHODS AND APPARATUS IN FINITE FIELD POLYNOMIAL IMPLEMENTATIONS; (10) U.S. Non-Provisional patent application Ser. No. 11/696,261, filed on Apr. 4, 2007, entitled BINARY AND N-VALUED LFSR AND LFCSR BASED SCRAMBLERS, DESCRAMBLERS, SEQUENCE GENERATORS AND DETECTORS IN GALOIS CONFIGURATION; (11) U.S. Non-Provisional patent application Ser. No. 11/964,507 filed on Dec. 26, 2007, entitled IMPLEMENTING LOGIC FUNCTIONS WITH NON-MAGNITUDE BASED PHYSICAL PHENOMENA; (12) U.S. Non-Provisional patent application Ser. No. 12/273,262, filed on Nov. 18, 2008, entitled Methods and Systems for N-state Symbol Processing with Binary Devices; (13) U.S. patent application Ser. No. 11/566,725, filed on Dec. 5, 2006, entitled ERROR CORRECTING DECODING FOR CONVOLUTIONAL AND RECURSIVE SYSTEMATIC CONVOLUTIONAL ENCODED SEQUENCES; (14) U.S. patent application Ser. No. 11/555,730 filed on Nov. 2, 2006, entitled SCRAMBLING AND SELF-SYNCHRONIZING DESCRAMBLING METHODS FOR BINARY AND NON-BINARY DIGITAL SIGNALS NOT USING LFSRs; (15) U.S. patent application Ser. No. 11/680,719 filed on Mar. 1, 2007, entitled MULTI-VALUED CHECK SYMBOL CALCULATION IN ERROR DETECTION AND CORRECTION; (16) U.S. patent application Ser. No. 11/739,189 filed on Apr. 24, 2007, entitled ERROR CORRECTION BY SYMBOL RECONSTRUCTION IN BINARY AND MULTI-VALUED CYCLIC CODES; (17) U.S. patent application Ser. No. 11/775,963 filed on Jul., 11, 2007, entitled Error Correction in Multi-Valued (p,k) Codes; (18) U.S. patent application Ser. No. 11/743,893 filed on May 3, 2007, entitled Symbol Reconstruction in Reed-Solomon Codes; (19) U.S. patent application Ser. No. 11/969,560 filed on Jan. 4, 2008, entitled Symbol Error Correction by Error Detection and Logic Based Symbol Reconstruction; (20) U.S. patent application Ser. No. 12/400,900 filed on Mar. 10, 2009, entitled Multi-State Symbol Error Correction in Matrix Based Codes; and (21) U.S. patent application Ser. No. 12/952,482 filed on Nov. 23, 2010, entitled Methods and Apparatus in Alternate Finite Field Based Coders and Decoders.

While there have been shown, described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims.

The invention claimed is:

1. A method for error correction of a codeword of n-state symbols with n>2 containing a plurality of n-state data symbols and a plurality of n-state check symbols generated by a coder, an n-state symbol being represented by a signal, each check symbol being determined by an n-state expression wherein the n-state data symbols are variables, comprising:
retrieving by a processor from a memory two or more expressions, each expression determining a comparative coding state of the coder, wherein the comparative coding state combines a first coding state of the coder operated in a first direction from a starting state to an ending state and a corresponding second coding state of the coder operated in a direction that is a reverse of the first direction;
the processor evaluating the two or more expressions, wherein received n-state data symbols and n-state check symbols are variables to determine a plurality of comparative coding states;
the processor locating an n-state symbol in error in the codeword based on the plurality of comparative coding states;
the processor determining an error value for the symbol in error in the codeword from at least one comparative coding state; and
the processor determining a correct state for the symbol in error by applying the error value to a state of the symbol in error.

2. The method of claim 1, wherein the comparative coding state is determined by the processor by evaluating a predetermined comparative coding expression that has at least a subset of the plurality of n-state symbols of the codeword as variables and wherein the coder is a Reed-Solomon coder.

3. The method of claim 2, wherein a partial result of the comparative coding expression is evaluated after an n-state symbol in the codeword has been received by the receiver and before a final n-state symbol in the codeword is available for processing by the processor.

4. The method of claim 2, wherein an n-state symbol that is generated by a comparative coding expression that determines a comparative coding state is applied to determine the error value.

5. The method of claim 2, wherein the comparative coding expression applies an n-state logic function that is defined over a finite field $GF(n)$.

6. The method of claim 2, wherein the codeword is characterized by an n-state Linear Feedback Shift Register.

7. The method of claim 2, wherein the comparative coding expression is represented by a plurality of coefficients.

8. The method of claim 1, wherein no syndrome is applied to determine the error location.

9. The method of claim 1, wherein an n-state symbol is represented by a plurality of binary signals.

10. The method of claim 1, wherein the method is implemented in a mobile communication receiver.

11. An apparatus to process a received codeword of n-state symbols with n>2 containing a plurality of n-state data symbols and a plurality of n-state check symbols generated by a coder, an n-state symbol being represented by a signal, each check symbol being determined by an n-state expression wherein n-state data symbols are variables, and wherein the coder is defined by an n-state Linear Feedback Shift Register with an initial state and a final state of a shift register, comprising:
a memory to store and retrieve data, including instructions;
a processor enabled to execute instructions to perform the steps:
determining a plurality of comparative coding states, each comparative coding state in the plurality of comparative coding states being determined by evaluating an expression that is determined by combining a first intermediate coding state of the coder operated in a first direction determined by the initial state and final state with a corresponding second intermediate coding state of the coder operated in a second direction that is a reverse of the first direction;
locating a symbol in error in the codeword from at least one of the plurality of comparative coding states;

determining an error value for the symbol in error from at least one comparative coding state; and determining a correct state for the symbol in error by combining a state of the symbol in error with the error value for the symbol in error.

12. The apparatus of claim 11, wherein each of the comparative coding states is determined by evaluating an comparative coding expression that has at least a subset of the plurality of n-state symbols in the received codeword as variables.

13. The apparatus of claim 12, wherein a partial result of the comparative coding expression is evaluated after an n-state symbol in the codeword has been received by the receiver and before a next n-state symbol in the codeword is available for processing by the processor.

14. The apparatus of claim 12, wherein an n-state symbol that is generated by a comparative coding expression that determines a comparative coding state is applied to determine the error value.

15. The apparatus of claim 12, wherein the comparative coding expression applies an n-state logic function that is defined over a finite field GF(n).

16. The apparatus of claim 11, wherein an n-state symbol is represented by a plurality of binary words.

17. The apparatus of claim 11, wherein the apparatus is part of a communication device.

18. The apparatus of claim 11, wherein the apparatus is part of a mobile communication receiving device.

19. The apparatus of claim 11, wherein the apparatus is part of a data storage device.

* * * * *